(12) United States Patent
Ito et al.

(10) Patent No.: US 9,881,773 B2
(45) Date of Patent: Jan. 30, 2018

(54) PRODUCTION METHOD OF ELECTROCONDUCTIVE MAYENITE COMPOUND HAVING HIGH ELECTRON DENSITY, AND TARGET

(71) Applicant: ASAHI GLASS COMPANY, LIMITED, Chiyoda-ku (JP)

(72) Inventors: Kazuhiro Ito, Chiyoda-ku (JP); Satoru Watanabe, Chiyoda-ku (JP); Toshinari Watanabe, Chiyoda-ku (JP); Naomichi Miyakawa, Chiyoda-ku (JP)

(73) Assignee: Asahi Glass Company, Limited, Chiyoda-ku (JP)

( * ) Notice: Subject to any disclaimer, the term of this patent is extended or adjusted under 35 U.S.C. 154(b) by 432 days.

(21) Appl. No.: 14/567,478

(22) Filed: Dec. 11, 2014

(65) Prior Publication Data

US 2015/0136593 A1    May 21, 2015

Related U.S. Application Data

(63) Continuation of application No. PCT/JP2013/066851, filed on Jun. 19, 2013.

(30) Foreign Application Priority Data

Jun. 20, 2012 (JP) .................. 2012-139199
Sep. 28, 2012 (JP) .................. 2012-217344
Mar. 29, 2013 (JP) .................. 2013-071162

(51) Int. Cl.
*C04B 35/44*      (2006.01)
*H01J 37/34*      (2006.01)
(Continued)

(52) U.S. Cl.
CPC .......... *H01J 37/3426* (2013.01); *C01F 7/164* (2013.01); *C04B 35/44* (2013.01);
(Continued)

(58) Field of Classification Search
CPC ..................... C04B 35/44; C04B 2235/6587
See application file for complete search history.

(56) References Cited

U.S. PATENT DOCUMENTS

2008/0095688 A1    4/2008    Hosono et al.
2011/0155970 A1    6/2011    Ito et al.

FOREIGN PATENT DOCUMENTS

EP    1 650 164 A1    4/2006
EP    2 708 521 A1    3/2014
(Continued)

OTHER PUBLICATIONS

U.S. Appl. No. 14/659,851, filed Mar. 17, 2015, Ito, et al.
(Continued)

*Primary Examiner* — Erin Snelting
(74) *Attorney, Agent, or Firm* — Oblon, McClelland, Maier & Neustadt, L.L.P.

(57) ABSTRACT

A production method of an electroconductive mayenite compound having an electron density greater than or equal to $5 \times 10^{20}$ cm$^{-3}$ includes preparing an object of processing containing a mayenite compound or a precursor of a mayenite compound, placing aluminum foil on at least part of a surface of the object of processing, and retaining the object of processing at temperatures falling within the range of 1080° C. to 1450° C. in a low oxygen partial pressure atmosphere.

12 Claims, 4 Drawing Sheets

(51) Int. Cl.
*H01B 1/08* (2006.01)
*C23C 14/34* (2006.01)
*C04B 35/626* (2006.01)
*C04B 35/645* (2006.01)
*C04B 37/02* (2006.01)
*C01F 7/16* (2006.01)

(52) U.S. Cl.
CPC ...... *C04B 35/6261* (2013.01); *C04B 35/6455* (2013.01); *C04B 37/021* (2013.01); *C23C 14/3414* (2013.01); *H01B 1/08* (2013.01); *C01P 2006/40* (2013.01); *C01P 2006/80* (2013.01); *C04B 2235/3208* (2013.01); *C04B 2235/3217* (2013.01); *C04B 2235/442* (2013.01); *C04B 2235/444* (2013.01); *C04B 2235/445* (2013.01); *C04B 2235/5436* (2013.01); *C04B 2235/6562* (2013.01); *C04B 2235/6565* (2013.01); *C04B 2235/6567* (2013.01); *C04B 2235/6581* (2013.01); *C04B 2235/6587* (2013.01); *C04B 2235/664* (2013.01); *C04B 2235/77* (2013.01); *C04B 2237/343* (2013.01); *C04B 2237/402* (2013.01); *C04B 2237/50* (2013.01)

(56) References Cited

FOREIGN PATENT DOCUMENTS

| | | |
|---|---|---|
| JP | 2009-298667 | 12/2009 |
| JP | 2010-132467 | 6/2010 |
| JP | 2012-082081 | 4/2012 |
| JP | 2012-101945 | 5/2012 |
| WO | 2005/000741 | 1/2005 |
| WO | 2006/129674 | 12/2006 |
| WO | 2006/129675 | 12/2006 |
| WO | 2010/024205 | 3/2010 |
| WO | 2010/041558 | 4/2010 |
| WO | 2010/095552 | 8/2010 |
| WO | 2013/051576 A1 | 4/2013 |

OTHER PUBLICATIONS

U.S. Appl. No. 14/659,866, filed Mar. 17, 2015, Ito, et al.
U.S. Appl. No. 14/567,478, filed Dec. 11, 2014, Ito, et al.
International Search Report issued in corresponding PCT/JP2013/066851, dated Aug. 20, 2013.
F.M. Lea, et al., The Chemistry of Cement and Concrete, $2^{nd}$ ed., p. 52, Edward Arnold & Co., London, 1956.

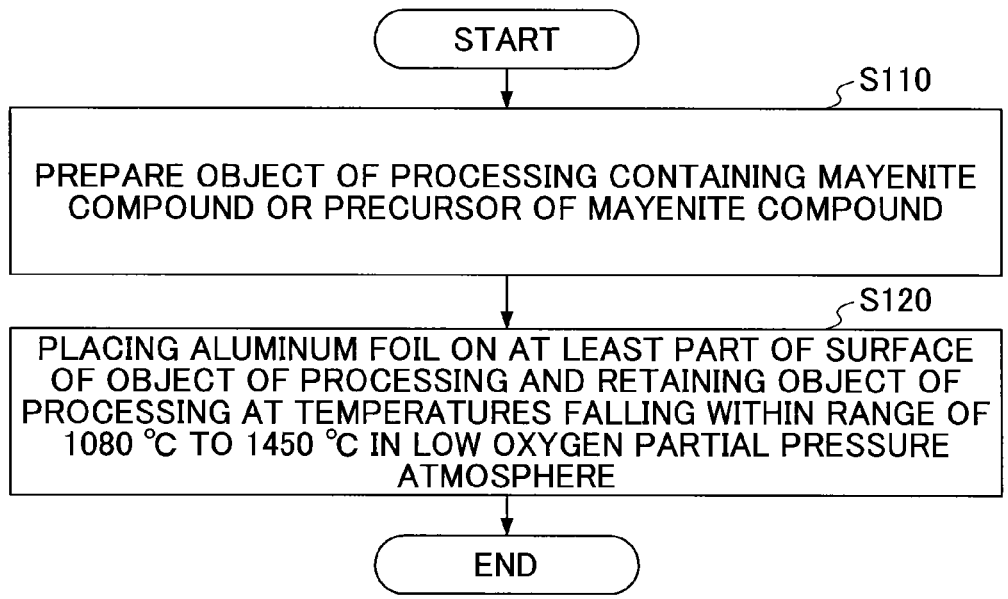
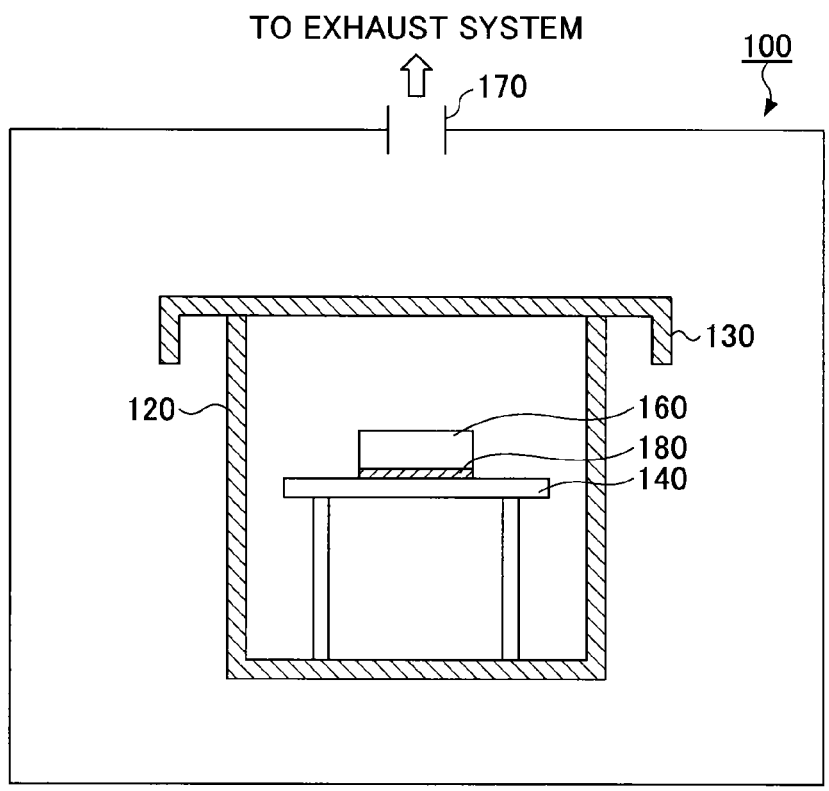

PRODUCTION METHOD OF ELECTROCONDUCTIVE MAYENITE COMPOUND HAVING HIGH ELECTRON DENSITY, AND TARGET

CROSS-REFERENCE TO RELATED APPLICATIONS

The present application is a continuation application filed under 35 U.S.C. 111(a) claiming benefit under 35 U.S.C. 120 and 365(c) of PCT International Application No. PCT/JP2013/066851, filed on Jun. 19, 2013 and designating the U.S., which claims priority to Japanese Patent Application No. 2012-139199, filed on Jun. 20, 2012, Japanese Patent Application No. 2012-217344, filed on Sep. 28, 2012, and Japanese Patent Application No. 2013-071162, filed on Mar. 29, 2013. The entire contents of the foregoing applications are incorporated herein by reference.

BACKGROUND OF THE INVENTION

1. Field of the Invention

The present invention relates to production methods of an electroconductive mayenite compound having high electron density.

2. Description of the Related Art

Mayenite compounds have a typical composition expressed by $12CaO \cdot 7Al_2O_3$, and have a characteristic crystal structure including three-dimensionally connected voids (cages) of approximately 0.4 nm in diameter. A frame forming these cages is positively charged, and forms 12 cages per unit lattice. One sixth of the cages are internally occupied by oxygen ions so as to satisfy the condition that the crystal is electrically neutral. These oxygen ions inside the cages, however, have a chemical characteristic different from other oxygen ions forming the frame. Therefore, in particular, the oxygen ions inside the cages are referred to as free oxygen ions. Mayenite compounds are also expressed as $[Ca_{24}Al_{28}O_{64}]^{4+} \cdot 2O^{2-}$ (Non-Patent Document 1).

A mayenite compound is provided with electrical conductivity when part or all of free oxygen ions inside the cages of the mayenite compound are replaced by electrons. This is because the electrons included in the cages of the mayenite compound are not so much confined to the cages and are freely movable inside the crystal (Patent Document 1). Such mayenite compounds having electrical conductivity are referred to as "electroconductive mayenite compounds" in particular.

Such electroconductive mayenite compounds may be produced by, for example, a production method by which a mayenite compound powder is put in a lidded carbon container and is subjected to heating at 1300° C. in a nitrogen gas atmosphere (Patent Document 2). Hereinafter, this method is referred to as Conventional Method 1.

Furthermore, electroconductive mayenite compounds may be produced by, for example, a production method by which a mayenite compound along with aluminum is put in a lidded alumina container and is subjected to heating at 1300° C. in a vacuum (Patent Document 2). Hereinafter, this method is referred to as Conventional Method 2.

PRIOR-ART DOCUMENTS

Patent Documents

[Patent Document 1] International Publication No. WO 2005/000741

[Patent Document 2] International Publication No. WO 2006/129674

[Non-Patent Document] F. M. Lea, C. H. Desch, The Chemistry of Cement and Concrete, $2^{nd}$ ed., p. 52, Edward Arnold & Co., London, 1956.

SUMMARY OF THE INVENTION

According to an aspect of the present invention, a production method of an electroconductive mayenite compound having an electron density greater than or equal to $5 \times 10^{20}$ $cm^{-3}$ includes preparing an object of processing containing a mayenite compound or a precursor of a mayenite compound, placing aluminum foil on at least part of a surface of the object of processing, and retaining the object of processing at temperatures falling within the range of 1080° C. to 1450° C. in a low oxygen partial pressure atmosphere.

According to an aspect of the present invention, a target for film deposition by vapor deposition includes an electroconductive mayenite compound having an electron density greater than or equal to $5 \times 10^{20}$ $cm^{-3}$, and has a minimum size of 5 mm or more.

BRIEF DESCRIPTION OF THE DRAWINGS

FIG. 2 is a flowchart schematically illustrating a production method of an electroconductive mayenite compound having high electron density according to an embodiment of the present invention;

FIG. 3 is a diagram schematically illustrating a configuration of an apparatus used in subjecting the object of processing to high temperature treatment;

DETAILED DESCRIPTION OF THE PREFERRED EMBODIMENTS

Figure 1A:
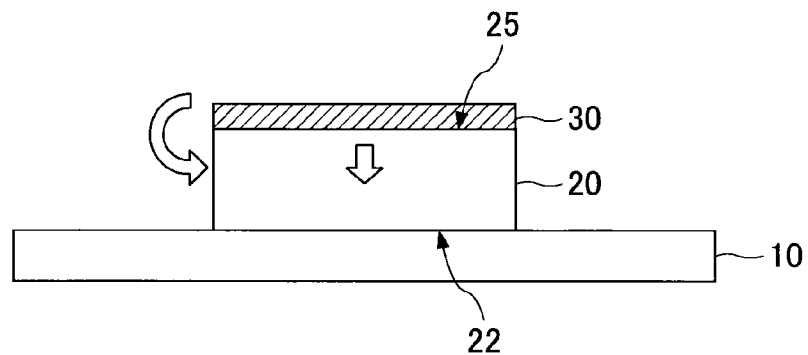
FIGS. 1A, 1B and 1C are diagrams for explaining effects in the case where aluminum foil is placed on a predetermined surface of an object of processing.

As described above, Patent Document 2 shows a method of producing an electroconductive mayenite compound, and according to this method, it is possible to produce an electroconductive mayenite compound having a high electron density exceeding $1 \times 10^{21}$ $cm^{-3}$.

According to the method described in Patent Document 2, however, it is necessary to perform heating with the object of processing being in contact with a large amount of aluminum powder. In this case, the following problem occurs.

That is, the melting point of aluminum is approximately 660° C., and aluminum powder liquefies in a temperature range at or above this. Therefore, according to the method described in Patent Document 2, when the object of processing is heated, the object of processing is immersed in a liquid of molten aluminum. When the temperature of the object of processing is lowered after the heating in this state, the object of processing after the heating, that is, an electroconductive mayenite compound, is half buried in the solidified aluminum. Because aluminum adheres to a container or the like used for heat treatment, it is extremely difficult to collect the electroconductive mayenite compound.

In order to collect the electroconductive mayenite compound, it is necessary to break the container or the like used for heat treatment with a hammer and carefully remove aluminum adhering around the electroconductive mayenite compound using a power saw, a ceramic hand grinder, and sandpaper. Thus, an additional process for separating the electroconductive mayenite compound and adhering matter of aluminum is required after the heating, so that the productivity is markedly reduced.

In particular, when a relatively large product such as a target for film deposition by vapor deposition is considered as use of the electroconductive mayenite compound, it is extremely unrealistic to easily collect the electroconductive mayenite compound from the container or the like used for heat treatment.

Because of this problem, there is a great demand for a production method of an electroconductive mayenite compound that makes it possible to easily collect an object of processing after heating.

According to an aspect of the present invention, a method of efficiently producing an electroconductive mayenite compound having high electron density is provided. Furthermore, according to an aspect of the present invention, a target of an electroconductive mayenite compound having high electron density for film deposition by vapor deposition is provided.

A detailed description is given below of the present invention.

According to the present invention, a production method of an electroconductive mayenite compound having an electron density greater than or equal to $5 \times 10^{20}$ cm$^{-3}$ that includes (1) the step of preparing an object of processing containing a mayenite compound or a precursor of a mayenite compound, and (2) the step of placing aluminum foil on at least part of a surface of the object of processing and retaining the object of processing at temperatures falling within a range of 1080° C. to 1450° C. in a low oxygen partial pressure atmosphere is provided.

Here, in the present application, the "mayenite compound" is a general term for 12CaO.7Al$_2$O$_3$ (hereinafter also referred to as "C12A7") having a cage structure and compounds having crystal structures equivalent to that of C12A7 (same-type compounds). A same-type compound equivalent to C12A7 is 12SrO.7Al$_2$O$_3$.

Furthermore, in the present application, the "electroconductive mayenite compound" refers to a mayenite compound having an electron density greater than or equal to $1.0 \times 10^{18}$ cm$^{-3}$ in which part or all of the "free oxygen ions" included in the cages are replaced by electrons. Furthermore, a mayenite compound having an electron density greater than or equal to $5 \times 10^{20}$ cm$^{-3}$ is particularly referred to as an "electroconductive mayenite compound having high electron density." The electron density in the case where all the free oxygen ions are replaced by electrons is $2.3 \times 10^{21}$ cm$^{-3}$. Accordingly, "mayenite compounds" include the "electroconductive mayenite compound," the "electroconductive mayenite compound having high electron density," and a "non-electroconductive mayenite compound."

According to the present invention, the electron density of a produced "electroconductive mayenite compound" is $5.0 \times 10^{20}$ cm$^{-3}$ or more, so that it is possible to obtain an "electroconductive mayenite compound having high electron density." The electron density of the electroconductive mayenite compound produced in the present invention is preferably greater than or equal to $7.0 \times 10^{20}$ cm$^{-3}$, and more preferably, greater than or equal to $1.0 \times 10^{21}$ cm$^{-3}$.

In general, the electron density of the electroconductive mayenite compound is measured by two methods depending on the electron density. That is, when the electron density is $1.0 \times 10^{18}$ cm$^{-3}$ to less than $3.0 \times 10^{20}$ cm$^{-3}$, the diffuse reflection of the powder of the electroconductive mayenite compound is measured, and the electron density is calculated from an absorbance (Kubelka-Munk transformation value) at 2.8 eV (a wavelength of 443 nm) of the absorption spectrum obtained by Kubelka-Munk transformation. This method uses the proportional relationship between the electron density and the Kubelka-Munk transformation value. A description is given below of a method of preparing a calibration curve.

Four samples having different electron densities are prepared, and the respective electron densities of the samples are determined from signal strengths of electron spin resonance (ESR). Electron densities measurable by ESR are approximately $1.0 \times 10^{14}$ cm$^{-3}$ to $1.0 \times 10^{19}$ cm$^{-3}$. A proportional relationship is obtained when the logarithms of the Kubelka-Munk transformation values and the electron densities determined by ESR are plotted. This was determined as a calibration curve. That is, according to this method, values are obtained by extrapolating the calibration curve where the electron density is $1.0 \times 10^{19}$ cm$^{-3}$ to $3.0 \times 10^{20}$ cm$^{-3}$.

On the other hand, when the electron density is $3.0 \times 10^{20}$ cm$^{-3}$ to $2.3 \times 10^{21}$ cm$^{-3}$, the diffuse reflection of the powder of the electroconductive mayenite compound is measured, and the electron density is obtained by converting the wavelength (energy) of a peak of the absorption spectrum obtained by Kubelka-Munk transformation. The relational expression used is as follows:

$$n = (-(E_{sp} - 2.83)/0.199)^{0.782},$$

where n indicates electron density (cm$^{-3}$) and $E_{sp}$ indicates the energy (eV) of a peak of the absorption spectrum obtained by Kubelka-Munk transformation.

Furthermore, according to the present invention, as long as the electroconductive mayenite compound has the C12A7 crystal structure composed of calcium (Ca), aluminum (Al) and oxygen (O), some of the atoms of at least one kind selected from calcium (Ca), aluminum (Al) and oxygen (O) may be replaced by other atoms or atomic groups. For example, calcium (Ca) may be partially replaced by atoms of at least one selected from the group consisting of magnesium (Mg), strontium (Sr), barium (Ba), lithium (Li), sodium (Na), chromium (Cr), manganese (Mn), cerium (Ce), cobalt (Co), nickel (Ni) and copper (Cu). Furthermore, aluminum (Al) may be partially replaced by atoms of at least one selected from the group consisting of silicon (Si), germanium (Ge), boron (B), gallium (Ga), titanium (Ti), manganese (Mn), iron (Fe), cerium (Ce), praseodymium (Pr), scandium (Sc), lanthanum (La), yttrium (Y), europium (Eu), ytterbium (Yb), cobalt (Co), nickel (Ni) and terbium (Tb). Furthermore, the oxygen of the frame of the cages may be replaced by nitrogen (N) or the like.

According to the present invention, the electroconductive mayenite compound may have at least some of the free oxygen ions inside the cages replaced by negative ions such as H$^-$, H$_2^-$, H$^{2-}$, O$^-$, O$_2^-$, OH$^-$, F$^-$, Cl$^-$ and S$^{2-}$ or negative ions of nitrogen (N).

In the electroconductive mayenite compound according to the present invention, the ratio of calcium (Ca) and aluminum (Al) preferably falls within the range of 10:9 to 13:6, more preferably within the range of 11:8 to 12.5:6.5, more preferably within the range of 11.5:7.5 to 12.3:6.7, and still more preferably within the range of 11.8:7.2 to 12.2:6.8, and is particularly preferably approximately 12:7, in mole ratio as converted to $CaO:Al_2O_3$. When calcium (Ca) is partially replaced by other atoms, the amount by mole of calcium and other atoms is regarded as the amount by mole of calcium. When aluminum (Al) is partially replaced by other atoms, the amount by mole of aluminum and other atoms is regarded as the amount by mole of aluminum.

In general, in the case of producing the electroconductive mayenite compound using an object of processing containing a mayenite compound, it is necessary to heat the object of processing in a "low oxygen partial pressure atmosphere," in order to replace oxygen inside the cages of the electroconductive mayenite compound to be produced by electrons and prevent oxygen from entering the cages. Accordingly, it is preferable that the oxygen partial pressure in this "low oxygen partial pressure atmosphere" be as low as possible.

According to the production method of the present invention, because aluminum vapor (supplied by the aluminum foil described below) is contained in an environment, it is possible to heat the object of processing in an atmosphere in which the oxygen partial pressure is sufficiently controlled. Therefore, it is possible to produce the electroconductive mayenite compound having high electron density.

The production method of the present invention is characterized in that aluminum foil is placed over at least part of a surface of the object of processing, and the object processing is retained at temperatures falling within the range of 1080° C. to 1450° C. to cause aluminum originating from the aluminum foil to come into contact with the at least part of the surface of the object of processing in the temperature range.

Here, when the aluminum foil is placed over the surface of the object of processing, the aluminum foil may be either in contact or out of contact with the surface of the object of processing. The aluminum foil, however, has to be so placed as to cause an aluminum melt originating from the aluminum foil to be in contact with the surface of the object of processing when the object of processing is retained at temperatures falling within the range of 1080° C. to 1450° C.

The aluminum foil may be placed on a "bottom surface" of the object of processing. The "bottom surface" of the object of processing means a surface that comes into contact with a table when the object of processing is placed on the table, that is, the lowermost surface in a vertical direction.

In addition to the "bottom surface" of the object of processing, the aluminum foil may also be placed so as to cover, for example, a top surface of the object of processing. Alternatively, for example, the aluminum foil may be placed so as to cover the entire exposed surface of the object of processing. Here, the "top surface" of the object of processing means a surface opposite to the bottom surface of the object of processing.

Such aluminum foil serves as an aluminum vapor source that supplies aluminum vapor into a heat treatment environment.

According to the JIS standards, aluminum foil is 6 μm to 200 μm. In the case where aluminum foil is used, the total amount of aluminum contained in the environment is relatively small even when the aluminum foil is so placed as to entirely cover all surfaces of the object of processing, that is, the aluminum foil used is maximum, for example. Accordingly, in this case, unlike the above-described method of Patent Document 2 that uses a large amount of aluminum powder, the immersion of the object of processing in a liquid of molten aluminum during heating is significantly controlled.

According to the production method of the present invention as well, the aluminum foil melts during heating. However, because an aluminum melt layer present on the surface of the object of processing is relatively thin, this melt reacts with, for example, environmental oxygen ($O_2$) or carbon monoxide (CO) gas or the like so as to relatively swiftly change into an aluminum compound of oxide, carbide or the like, such as $Al_2O_3$ or $Al_4C_3$.

Furthermore, such an aluminum compound is generated from aluminum foil and is therefore extremely thin. Furthermore, the aluminum compound is less likely to sinter or melt in the below-described temperature range for heating the object of processing. Therefore, the aluminum compound is prevented from adhering in a large amount to the object of processing after heating. Furthermore, the aluminum compound is also prevented from adhering in a large amount to the container or the like used for heat treatment. Accordingly, it is possible to easily collect the object of processing after heating, that is, the electroconductive mayenite compound.

Therefore, according to the production method of the present invention, it is possible to significantly control the problem according to the conventional production method, that is, the problem that aluminum adheres to a surface of the object of processing and a container or the like used for heat treatment after heating so as to make it difficult to collect the object of processing after heating, that is, the electroconductive mayenite compound.

Because of the above, according to the production method of an electroconductive mayenite compound according to the present invention, it is possible to efficiently produce the electroconductive mayenite compound having high electron density.

Furthermore, the production method of an electroconductive mayenite compound having high electron density according to the present invention is significantly applicable even to a relatively large product such as a target for film deposition by vapor deposition because the process of collecting the electroconductive mayenite compound having high electron density is simplified. Therefore, according to the production method of the present invention, it is possible to produce a relatively large product of the electroconductive mayenite compound having high electron density.

According to the production method of an embodiment of the present invention, it is possible to place aluminum foil on the bottom surface of the object of processing. By placing aluminum foil on the bottom surface of the object of processing, it is possible to economically produce the electroconductive mayenite compound having high electron density of a limited "variation" in electron densities.

Figure 1B:
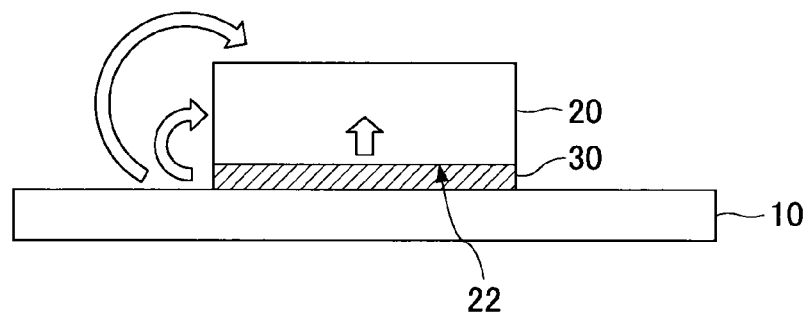
Figure 1C:
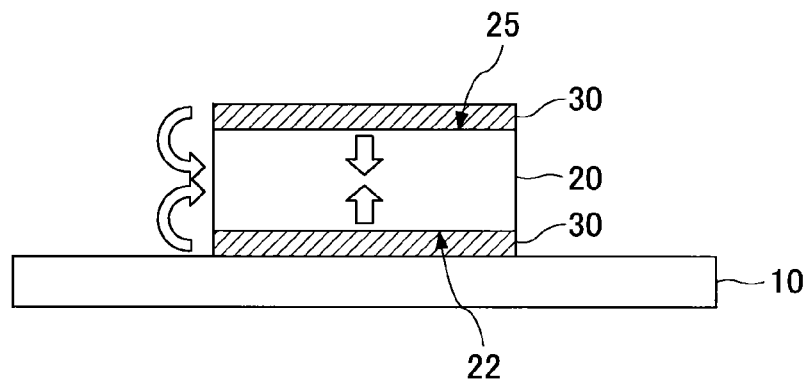

FIGS. 1A, 1B and 1C illustrate states where an object of processing is placed on a table for heating. FIG. 1A illustrates the case where aluminum foil is placed on the top surface of the object of processing. FIG. 1B illustrates the case where aluminum foil is placed on the bottom surface of the object of processing. Furthermore, FIG. 1C illustrates the case where aluminum foil is placed on the bottom surface and the top surface of the object of processing.

First, the case where no aluminum foil is placed on a bottom surface 22 of an object of processing 20 placed on a table 10 and aluminum foil 30 is placed only on a top surface 25 of the object of processing 20 as illustrated in FIG. 1A is considered.

In this case, because the bottom surface 22 of the object of processing 20 comes into contact with the table 10, the contact of this bottom surface 22 with an environmental gas tends to be easily hindered. Accordingly, aluminum vapor from the aluminum foil 30 is less likely to be supplied to the bottom surface 22 of the object of processing 20 while being sufficiently supplied to the upper surface 25 and side surfaces of the object of processing 20.

A relatively thin object of processing may be heated in this state without a problem. In the case of heating a relatively thick object of processing in this state, however, a supply of aluminum vapor from the environment side to the bottom surface 22 is insufficient. Therefore, the reduction reaction of the object of processing 20 may be prevented from progressing sufficiently on and inside the bottom surface 22 of the object of processing 20 than on other sides of the object of processing 20.

On the other hand, in the case where the aluminum foil 30 is placed on the bottom surface 22 of the object of processing 20 as illustrated in FIG. 1B, aluminum vapor from the aluminum foil 30 side is sufficiently supplied not only to the top surface 25 and side surfaces of the object of processing 20 but also to and inside the bottom surface 22 of the object of processing 20.

Accordingly, in this case, the reduction reaction of the object of processing 20 sufficiently progresses on and inside the bottom surface 22 of the object of processing 20 as well, so that it is possible to produce the electroconductive mayenite compound having high electron density of a limited "variation" in electron densities.

From such a viewpoint, in an embodiment according to the present invention, the aluminum foil 30 may be placed on the bottom surface 22 of the object of processing 20.

In the case where the aluminum foil 30 is placed on both the bottom surface 22 and the top surface 25 of the object of processing 20 as illustrated in FIG. 1C, it is possible to sufficiently supply aluminum vapor from both the bottom surface 22 side and the top surface 25 side of the object of processing 20 to each part of the object of processing 20. Accordingly, in this case, the effect is produced that it is possible to swiftly reduce the object of processing 20.

Furthermore, although not illustrated in FIGS. 1A through 1C, for the same reason, the aluminum foil 30 may be so placed as to cover the entire surface of the object of processing 20 including the bottom surface 22 and the top surface 25 of the object of processing 20.

(Production Method of an Electroconductive Mayenite Compound Having High Electron Density According an Embodiment of the Present Invention)

A detailed description is given below, with reference to drawings, of a production method according to an embodiment of the present invention.

FIG. 2 illustrates a production method of an electroconductive mayenite compound having high electron density according to an embodiment of the present invention.

As illustrated in FIG. 2, a production method according to an embodiment of the present invention includes (1) the step of preparing an object of processing containing a mayenite compound or a precursor of a mayenite compound (step S110) and (2) the step of placing aluminum foil on at least part of a surface of the object of processing and retaining the object of processing at temperatures falling within the range of 1080° C. to 1450° C. in a low oxygen partial pressure atmosphere (step S120). A description is given below of each process.

(Step S110: Preparation Process of the Object of Processing)

In this step S110, an object of processing containing a mayenite compound is prepared. The mayenite compound may be the electroconductive mayenite compound, the electroconductive mayenite compound having high electron density, or a non-electroconductive mayenite compound.

The object of processing may be a forming body that contains a mayenite compound powder. Alternatively, the object of processing may be a sintered body that contains a mayenite compound. In the latter case, the sintered body may be a forming body that contains a mayenite compound powder that is at least partially sintered by being heated. The object of processing may also be a forming body that contains a precursor of a mayenite compound. The precursor of a mayenite compound may be a forming body of calcined powder.

A description is given below of the preparation process of the object of processing, taking the case where the object of processing is a forming body that contains a mayenite compound powder as an example.

When the object of processing is a forming body that contains a mayenite compound powder, this powder is synthesized and produced by heating raw material powder to high temperatures in the manner illustrated below.

First, a raw material powder for synthesizing a mayenite compound powder is prepared. The raw material powder is prepared so that the ratio of calcium (Ca) and aluminum (Al) is 14:5 to 10:9 in mole ratio as converted to $CaO:Al_2O_3$. In particular, the ratio of calcium (Ca) and aluminum (Al) is preferably 13:6 to 11:8, more preferably, 12.6:6.4 to 11.7:7.3, and still more preferably, 12.3:6.7 to 11.8:7.2 in mole ratio as converted to $CaO:Al_2O_3$. Ideally, $CaO:Al_2O_3$ (mole ratio) is preferably approximately 12:7. Compounds used for the raw material powder are not limited in particular as long as the above-described ratio is maintained.

The raw material powder preferably contains calcium aluminate or contains at least two selected from the group consisting of a calcium compound, an aluminum compound, and calcium aluminate. The raw material powder may also be, for example, a powder mixture including a calcium compound and an aluminum compound. The raw material powder may also be, for example, a powder mixture including a calcium compound and calcium aluminate. Furthermore, the raw material powder may also be, for example, a powder mixture including an aluminum compound and calcium aluminate. Furthermore, the raw material powder may also be, for example, a powder mixture including a calcium compound, an aluminum compound, and calcium aluminate. Furthermore, the raw material powder may also be, for example, a powder including only calcium aluminate.

Calcium compounds include calcium carbonate, calcium oxide, calcium hydroxide, calcium hydrogen carbonate, calcium sulfate, calcium metaphosphate, calcium oxalate, calcium acetate, calcium nitrate, and calcium halide. Of these, calcium carbonate, calcium oxide, and calcium hydroxide are preferable.

Aluminum compounds include aluminum hydroxide, aluminum oxide, aluminum sulfate, aluminum nitrate, and aluminum halide. Of these, aluminum hydroxide and aluminum oxide are preferable. Aluminum oxide (alumina) includes α-alumina, γ-alumina, and δ-alumina, and α-aluminum oxide (alumina) is particularly preferable.

Calcium aluminate is preferably $CaO.Al_2O_3$, $3CaO.Al_2O_3$, $5CaO.3Al_2O_3$, $CaO.2Al_2O_3$, $CaO.6Al_2O_3$ or the like. C12A7 may be used in mixture with a calcium compound or an aluminum compound.

Furthermore, the raw material powder may further contain halogen components such as fluorine (F) and/or chlorine (Cl). Examples of fluorine (F) components include calcium fluoride ($CaF_2$). Furthermore, examples of chlorine (Cl) components include calcium chloride ($CaCl_2$).

In the case of adding a halogen component to the raw material powder, it is possible to produce the electroconductive mayenite compound having high electron density or the like in which halogen ions are introduced in the cages at the end (after step S120).

The raw material powder including a halogen component is not limited to this, and may be prepared by, for example, adding calcium halide to the powder mixture of a calcium compound and an aluminum compound as described above.

The halogen component content of the raw material powder is not limited in particular. The halogen component content may be selected so that, for example, the range of x is 0 to 0.60 when the chemical formula of the electroconductive mayenite compound obtained at the end is expressed by:

$$(12-x)CaO \cdot 7Al_2O_3 \cdot xCaA_2, \qquad (1)$$

where A represents halogen.

Next, the prepared raw material powder is retained at high temperatures, so that the mayenite compound is synthesized. The synthesis, which may be performed in an inert gas atmosphere or in a vacuum, is preferably performed in the atmosphere.

The synthesis temperature, which is not limited in particular, falls, for example, within the range of 1150° C. to 1460° C., preferably, within the range of 1200° C. to 1415° C., more preferably, within the range of 1250° C. to 1400° C., and still more preferably, within the range of 1300° C. to 1350° C. When the synthesis is performed in the temperature range of 1150° C. to 1460° C., a mayenite compound containing a large number of C12A7 crystal structures is likely to be obtained. When the synthesis temperature is too low, C12A7 crystal structures may be reduced. On the other hand, when the synthesis temperature is too high, the melting point of the mayenite compound is exceeded, so that C12A7 crystal structures may be reduced.

In the case of fluorine-free mayenite compounds, the synthesis temperature is more preferably 1250° C. to 1415° C., still more preferably, 1270° C. to 1400° C., and particularly preferably, 1300° C. to 1350° C.

In the case of fluorine-containing mayenite compounds, the synthesis temperature is more preferably 1180° C. to 1450° C., still more preferably, 1200° C. to 1400° C., and particularly preferably, 1250° C. to 1350° C. Fluorine-containing mayenite compounds are easy to produce because of a wide synthesis temperature range due to higher melting points of the compounds.

The retention time at high temperatures is not limited in particular. This varies depending on the amount of synthesis and retention temperatures. The retention time is, for example, 1 hour to 12 hours. The retention time is preferably 2 hours to 10 hours, and more preferably, 4 hours to 8 hours, for example. By retaining the raw material powder at high temperatures for 2 hours or more, a solid-phase reaction sufficiently progresses, so that it is possible to obtain a homogeneous mayenite compound.

The mayenite compound obtained by the synthesis is in the form of a partially or entirely sintered mass. The below-described process of step S120 may be performed on the massive mayenite compound. In order to obtain an electroconductive mayenite compound that has a desired shape or is homogeneous, however, it is preferable to produce a mayenite compound powder by performing the below-described pulverization of the mayenite compound.

The massive mayenite compound is pulverized to, for example, approximately 5 mm in size with a stamp mill or the like, and is further pulverized to approximately 10 μm to 100 μm in average particle size with an automatic mortar or a dry ball mill. Here, the "average particle size" means a value obtained by performing measurement by laser diffraction and scattering. Hereinafter, the average particle size of powder means a value measured in the same manner.

When it is desired to obtain a finer and more uniform powder, it is possible to micronize powder to 0.5 μm to 50 μm in average particle size by, for example, using alcohol expressed by $C_nH_{2n+1}OH$ (n is an integer greater than or equal to three) (such as isopropyl alcohol) as a solvent and using a dry ball mill, a circulation bead mill or the like. Water cannot be used as a solvent because the mayenite compound is a component of alumina cement and easily reacts with water to generate a hydrate.

By the above-described process, a mayenite compound powder is prepared.

When the raw material powder contains a halogen component, it is possible to obtain a mayenite compound having halogen ions introduced in some of the cages.

The mayenite compound prepared as powder may be the electroconductive mayenite compound. In the case of producing the electroconductive mayenite compound, example methods are as follows: the production method by which a mayenite compound is put in a lidded carbon container and heated at 1600° C. (International Publication No. WO 2005/000741); the production method by which a mayenite compound is put in a lidded carbon container and heated at 1300° C. in nitrogen (International Publication No. WO 2006/129674); the production method by which a powder of calcium aluminate or the like produced from a calcium carbonate powder and an aluminum oxide powder is put in a lidded carbon crucible and heated at 1300° C. in nitrogen (International Publication No. WO 2010/041558); and a powder mixture of a calcium carbonate powder and an aluminum oxide powder is put in a lidded carbon crucible and heated at 1300° C. in nitrogen (Japanese Laid-Open Patent Application No. 2010-132467).

Alternatively, a powder mixture of a non-electroconductive mayenite compound and the electroconductive mayenite compound may be used.

Next, a forming body is formed using the obtained mayenite compound powder. (By the way, in the case of using a sintered body including a mayenite compound as an object of processing, this forming body is sintered so that the sintered body is formed.)

The method of forming a forming body is not limited in particular, and various conventional methods may be employed to form the forming body. For example, the forming body may be prepared through the pressure forming of a forming material formed of a mayenite compound powder or a kneaded material including the powder. The forming body may be obtained through the press forming, sheet forming, extrusion forming or injection forming of the forming material. The shape of the forming body is not limited in particular. If the forming body contains a binder, it is preferable to remove the binder by pre-heating the forming body.

By the above-described method, it is possible to prepare a forming body including a mayenite compound powder.

On the other hand, in the case of producing a sintered body including a mayenite compound using the obtained forming body including a mayenite compound powder, the process temperature is not limited in particular if the process temperature is a condition under which the forming body is sintered. The forming body including a mayenite compound powder is sintered within the temperature range of, for example, 300° C. to 1450° C., so that a sintered body including a mayenite compound is formed. The sintering is likely to progress at or above 300° C. because an organic component volatilizes so that the powder has more contacts. The shape of the sintered body is likely to be retained at or below 1450° C. The highest temperature of the heat treatment falls approximately within the range of 1000° C. to 1420° C., preferably, 1050° C. to 1415° C., more preferably, 1100° C. to 1380° C., and still more preferably, 1250° C. to 1350° C.

The retention time at the highest temperature of the heat treatment falls approximately within the range of 1 hour to 50 hours, preferably, 2 hours to 40 hours, more preferably, 3 hours to 30 hours, and still more preferably, 4 hours to 10 hours. Extending the retention time causes no particular problem in terms of characteristics. Considering a production cost, however, the retention time is preferably less than or equal to 48 hours.

The sintering may be performed in the atmosphere or may be performed in an atmosphere of an inert gas such as argon, helium, neon, or nitrogen, an oxygen gas, or their mixture, or in a vacuum.

The obtained sintered body including a mayenite compound may be processed into a desired shape as required. The processing method is not limited in particular, and machining, electrical discharge machining, laser processing or the like may be applied.

The size of the object of processing is not limited in particular. It has to be noted, however, that the production method according to an embodiment of the present invention, according to which, in contrast to conventional ones, it is not difficult to collect the object of processing after heat treatment so that it is possible to simplify the process of separating adhering matter of aluminum, is significantly applicable to an object of processing relatively large in size.

A description is given below of the preparation process of the object of processing, taking the case where the object of processing is a forming body of calcined powder as an example.

In the present application, the "calcined powder" means a powder prepared through heat treatment that is (i) a powder mixture including at least two selected from calcium oxide, aluminum oxide, and calcium aluminate or (ii) a powder mixture of two or more kinds of calcium aluminate. Examples of calcium aluminate include $CaO \cdot Al_2O_3$, $3CaO \cdot Al_2O_3$, $5CaO \cdot 3Al_2O_3$, $CaO \cdot 2Al_2O_3$, $CaO \cdot 6Al_2O_3$, and C12A7. The ratio of calcium (Ca) and aluminum (Al) in the "calcined powder" is 9.5:9.5 to 13:6 in mole ratio as converted to $CaO:Al_2O_3$.

In particular, the preparation is performed so that the ratio of calcium (Ca) and aluminum (Al) falls within the range of 10:9 to 13:6 in mole ratio as converted to $CaO:Al_2O_3$. $CaO:Al_2O_3$ (mole ratio) preferably falls within the range of 11:8 to 12.5:6.5, more preferably, within the range of 11.5:7.5 to 12.3:6.7, and still more preferably, within the range of 11.8:7.2 to 12.2:6.8, and is particularly preferably approximately 12:7.

The calcined powder is also referred to as a "precursor" of a mayenite compound.

The calcined powder may be prepared in the following manner.

First, a raw material powder is prepared. The raw material powder includes at least raw materials to serve as a calcium oxide source and an aluminum oxide source.

For example, it is preferable that the raw material powder includes two or more kinds of calcium aluminate or includes at least two selected from the group consisting of a calcium compound, an aluminum compound, and calcium aluminate.

The raw material powder may be, for example, the following raw material powders: a raw material powder including a calcium compound and an aluminum compound; a raw material powder including a calcium compound and calcium aluminate; a raw material powder including an aluminum compound and calcium aluminate; a raw material powder including a calcium compound, an aluminum compound, and calcium aluminate; and a raw material powder including calcium aluminate only.

A description is given below of a preparation method of the calcined powder, imagining the case where the raw material powder includes at least a raw material A to serve as a calcium oxide source and a raw material B to serve as an aluminum oxide source as a typical example.

As the raw material A, calcium carbonate, calcium oxide, calcium hydroxide, calcium hydrogen carbonate, calcium sulfate, calcium metaphosphate, calcium oxalate, calcium acetate, calcium nitrate, and calcium halide are named. Of these, calcium carbonate, calcium oxide, and calcium hydroxide are preferable.

As the raw material B, aluminum hydroxide, aluminum oxide, aluminum sulfate, aluminum nitrate, and aluminum halide are named. Of these, aluminum hydroxide and aluminum oxide are preferable. Aluminum oxide (alumina) includes α-alumina, γ-alumina, and δ-alumina, and α-aluminum oxide (alumina) is preferable.

The calcined powder may contain a substance other than the raw material A and the raw material B.

Next, the raw material powder including the raw material A and the raw material B is heated. As a result, a calcined powder including calcium and aluminum is obtained. As described above, the ratio of calcium (Ca) and aluminum (Al) in the calcined powder falls approximately within the range of 10:9 to 13:6 in mole ratio as converted to CaO: $Al_2O_3$.

The highest temperature of the heat treatment falls approximately within the range of 600° C. to 1250° C., preferably, 900° C. to 1200° C., and more preferably, 1000° C. to 1100° C. The retention time at the highest temperature of the heat treatment falls approximately within the range of 1 hour to 50 hours, preferably, 2 hours to 40 hours, and more preferably, 3 hours to 30 hours. Extending the retention time causes no particular problem in terms of characteristics. Considering a production cost, however, the retention time is preferably less than or equal to 48 hours.

The heat treatment may be performed in the atmosphere. The heat treatment may alternatively be performed in an atmosphere of an inert gas such as argon, helium, neon, or nitrogen, an oxygen gas, or their mixture, or in a vacuum.

The calcined powder obtained after the heat treatment is normally in the form of a partially or entirely sintered mass. Therefore, pulverization (coarse pulverization and/or micronization) may be performed.

Next, a forming body is formed using the calcined powder prepared as described above. As a method of forming the forming body, the same method as the above-described preparation method of a forming body of a mayenite compound powder may be applied. Therefore, no further description is given here. By the above-described process, a forming body of the calcined powder is prepared.

[Step S120: Heat Treatment Process of the Object of Processing]

Next, the object of processing is subjected to high temperature treatment in a low oxygen partial pressure atmosphere. As a result, when the object of processing is a forming body including a mayenite compound powder or a sintered body that is partially sintered, the sintering of mayenite compound particles in the object of processing progresses, and oxygen ions inside the cages of the mayenite compound are replaced by electrons, so that an electroconductive mayenite compound is generated. In the case where the object of processing is an entirely sintered body including a mayenite compound, oxygen ions inside the cages of the mayenite compound are replaced by electrons, so that an electroconductive mayenite compound is generated.

Here, as described above, according to the production method according to an embodiment of the present invention, aluminum foil is placed on at least part of a surface of the object of processing. When aluminum foil is placed on a surface of the object of processing, the aluminum foil may be either in contact or out of contact with the surface of the object of processing. The aluminum foil, however, has to be so placed as to cause an aluminum melt originating from the aluminum foil to be in contact with the surface of the object of processing when the object of processing is retained at temperatures falling within the range of 1080° C. to 1450° C.

As described above, the aluminum foil is preferably placed on the bottom surface and/or the top surface of the object of processing, and more preferably, placed on the bottom surface and the top surface of the object of processing. The aluminum foil may be placed on, for example, the entire surface of the object of processing. When the aluminum foil is under the object of processing, most of the aluminum foil becomes aluminum carbide after heat treatment with the presence of a carbon monoxide (CO) gas source, so as to also serve as a material for parting the electroconductive mayenite compound from a setter.

The thickness of the aluminum foil is not limited in particular, and may fall within the range of, for example, 5 µm to 1000 µm. Furthermore, the aluminum foil may be placed on the bottom surface of the object of processing in multiple layers as long as the total thickness is in this range. The thickness of the aluminum foil is preferably 10 µm to 400 µm, more preferably, 15 µm to 100 µm, still more preferably, 20 µm to 60 µm, and particularly preferably, 25 µm to 50 µm.

The aluminum foil may adopt such thickness as to cause the electron density of the electroconductive mayenite compound to be greater than or equal to $5 \times 10^{20}$ cm$^{-3}$.

Next, this object of processing having aluminum foil placed on at least part of its surface is subjected to high temperature treatment in a low oxygen partial pressure atmosphere.

Here, the "low oxygen partial pressure atmosphere" means a general term for atmospheres where the oxygen partial pressure in an environment is less than or equal to $10^{-3}$ Pa, and the environment may be an inert gas atmosphere or a reduced pressure atmosphere (for example, a vacuum environment where the pressure is less than or equal to 100 Pa). The oxygen partial pressure is preferably less than or equal to $10^{-5}$ Pa, more preferably, less than or equal to $10^{-10}$ Pa, still more preferably, less than or equal to $10^{-15}$ Pa, and particularly preferably, less than or equal to $10^{-18}$ Pa.

For example, the heat treatment may be performed in a vacuum atmosphere where the pressure is less than or equal to 100 Pa. The pressure may be less than or equal to 70 Pa. For example, the pressure may be less than or equal to 30 Pa or less than or equal to 10 Pa, or may be less than or equal to 1 Pa. A lower pressure is more preferable.

Alternatively, a container or the like used for heat treatment may be used in an inert gas atmosphere (except nitrogen gas) where the oxygen partial pressure is less than or equal to 100 Pa. The partial pressure of oxygen of the inert gas atmosphere supplied from outside the system is less than or equal to 100 Pa, for example, less than or equal to 10 Pa, or may be less than or equal to 1 Pa, for example, less than or equal to 0.1 Pa.

The inert gas atmosphere may be an argon gas atmosphere. According to an embodiment of the present invention, however, it is not preferable to use nitrogen gas as an inert gas. Nitrogen gas reacts with aluminum vapor present in a reaction environment so as to generate aluminum nitride. Therefore, aluminum vapor necessary to reduce the mayenite compound is less likely to be supplied because of generation of aluminum nitride.

The low oxygen partial pressure atmosphere may contain carbon monoxide gas. The carbon monoxide gas may be externally supplied into an environment in which the object of processing is placed. Alternatively, the object of processing may be placed inside a carbon-containing container, and a carbon monoxide gas may be supplied from this container side. As the container, for example, a carbon container may be used or a carbon sheet and/or a carbon plate may be placed in the environment.

The heat treatment temperature falls within the range of 1080° C. to 1450° C., preferably, within the range of 1150° C. to 1380° C., more preferably, 1180° C. to 1350° C., and still more preferably, 1200° C. to 1340° C., and is particularly preferably 1230° C. to 1330° C. When the heat treatment temperature is lower than 1080° C., it may be impossible to provide the mayenite compound with sufficient electrical conductivity. Furthermore, when the heat treatment temperature is higher than 1450° C., the melting point of the mayenite compound is exceeded, thus causing the decomposition of the crystal structure to decrease the electron density.

In the case of the object of processing that does not contain a halogen component, when the heat treatment temperature is 1180° C. to 1350° C., an electroconductive mayenite compound having an electron density greater than or equal to $1.0 \times 10^{21}$ cm$^{-3}$ is likely to be obtained when the minimum size of the electroconductive mayenite compound obtained after heat treatment is greater than or equal to 5 mm. At 1200° C. to 1340° C., an electroconductive mayenite compound having an electron density greater than or equal to $1.3 \times 10^{21}$ cm$^{-3}$ is likely to be obtained, and the sintered body is further less likely to deform. At 1230° C. to 1330° C., the relative density of the obtained electroconductive mayenite compound is likely to be greater than or equal to 95%.

On the other hand, when the object of processing contains a halogen component, the heat treatment temperature falls within the range of 1080° C. to 1450° C., preferably, 1130° C. to 1400° C., more preferably, 1150° C. to 1380° C., particularly preferably, 1180° C. to 1370° C., and most preferably, 1200° C. to 1350° C.

The high temperature retention time of the object of processing preferably falls within the range of 30 minutes to 50 hours. When the retention time of the object of processing is less than 30 minutes, sintering is insufficient, and the obtained sintered body may be subject to breakage. Furthermore, extending the retention time causes no particular problem in terms of characteristics, but the retention time is preferably less than or equal to 50 hours because of easiness of retaining a desired shape of the mayenite compound. Furthermore, in view of avoiding wasting energy, the retention time is preferably less than or equal to 40 hours, and more preferably, less than or equal to 24 hours.

The retention time is preferably 1 hour to 18 hours, more preferably, 2 hours to 12 hours, and particularly preferably, 3 hours to 12 hours.

Furthermore, in order to facilitate collection of the electroconductive mayenite compound, powder, a plate or the like of a ceramic that is less easily sinterable to the container or the like used for heat treatment and/or the electroconductive mayenite compound, such as boron nitride (BN) or tantalum oxide ($Ta_2O_5$), may be diffused and/or placed in an environment in which heat treatment is performed. At this point, it has to be noted that the extent is such that the electron density or the C12A7 structure of the obtained electroconductive mayenite compound is not impaired.

By the above-described process, it is possible to produce the electroconductive mayenite compound having an electron density greater than or equal to $5.0 \times 10^{20}$ cm$^{-3}$. In the case where the object of processing that contains a fluorine component is used in [step S110], a fluorine-containing electroconductive mayenite compound having high electron density is produced. In this case, fluorine may be either introduced in the cages or introduced in the frame of the cages.

As described above, aluminum foil forms only a thin melt layer even when melted during heat treatment, so that the object of processing is less likely to be immersed in a liquid of molten aluminum. Furthermore, this thin melt layer reacts with environmental oxygen gas or carbon monoxide gas so as to relatively swiftly change into an aluminum compound of oxide or carbide, such as $Al_2O_3$ or $Al_4C_3$. Such an aluminum compound is generated from aluminum foil and is therefore extremely thin. Furthermore, the aluminum compound is less likely to sinter or melt in a temperature range in which the object of processing is heated, and therefore, does not adhere to the object of processing in a large amount after the heat treatment and does not adhere to the container or the like used at the time of heat treatment, either. Accordingly, the object of processing after heat treatment, that is, the electroconductive mayenite compound, is easily collectable.

Therefore, according to the production method according to an embodiment of the present invention, it is possible to significantly control the problem according to conventional production methods, that is, the problem that aluminum adheres to a surface of the object of processing and a container or the like used for heat treatment after heat treatment so that the object of processing after heat treatment, that is, the electroconductive mayenite compound, is difficult to collect.

Therefore, according to the production method according to an embodiment of the present invention, it is possible to efficiently produce the electroconductive mayenite compound having high electron density. It has to be noted that the above description of the process is merely one example and that the production method according to an embodiment of the present invention may include other processes.

FIG. 3 schematically illustrates a configuration of an apparatus used at the time of heating the object of processing. An apparatus 100 is formed entirely of an electric furnace capable of controlling an atmosphere including a vacuum, and has an exhaust port 170 connected to an exhaust system.

The apparatus 100 includes an open-top container 120, a lid 130 placed on top of the container 120, and a sample support 140 inside the electric furnace capable of controlling an atmosphere including a vacuum. The container 120 may be made of carbon or alumina.

The sample support 140 is formed of a material that does not react with aluminum vapor or an object of processing 160 at the time of high temperature treatment. For example, the sample support 140 may be formed of a carbon plate or an alumina plate. The sample support 140 may be omitted.

The object of processing 160 including a mayenite compound is placed on top of the sample support 140 (or in the container 120 in the absence of the sample support 140). Furthermore, aluminum foil 180 is placed on a bottom surface of the object of processing 160. Aluminum foil, however, is not limited to the bottom surface of the object of processing 160. Aluminum foil may be placed at any location where it is possible for aluminum originating from the aluminum foil to come into contact with the object of processing 160 during heat treatment.

At the time of heat treatment, the aluminum foil 180 on the bottom surface of the object of processing 160 melts at or above the melting point. Furthermore, aluminum vapor is present in the space surrounded by the container 120 and the lid 130. Accordingly, aluminum serves as a reducing agent, so that the mayenite compound of the object of processing 160 becomes the electroconductive mayenite compound by the reaction of Eq. (2):

$$3O^{2-} + 2Al \rightarrow 6e^- + Al_2O_3. \qquad (2)$$

When the container 120 and/or the lid 130 is made of carbon, the container 120 and/or the lid 130 serves as a supply source of carbon monoxide gas. That is, during the heat treatment of the object of processing 160, carbon monoxide gas is generated from the container 120 and/or the lid 130 side.

Environmental oxygen gas or carbon monoxide gas serves to prevent an aluminum melt layer generated by the melting of the aluminum foil 180 from firmly adhering to the bottom surface of the object of processing 160 after heat treatment. More specifically, this aluminum melt layer reacts with environmental oxygen gas or carbon monoxide gas so as to generate aluminum compounds such as aluminum oxide (for example, $Al_2O_3$), aluminum carbide (for example, $Al_4C_3$), and aluminum oxycarbide (for example, $Al_4O_4C$). Such aluminum compounds are generated from aluminum foil. Therefore, such aluminum compounds are extremely thin, and aluminum hardly remains. Thus, such aluminum compounds hardly adhere to the electroconductive mayenite compound or the sample support 140.

Accordingly, by heating the object of processing 160 using the apparatus 100, the object of processing 160 is reduced, so that an electroconductive mayenite compound product is formed. A thin aluminum compound is interposed between a surface of the electroconductive mayenite compound and the sample support 140, so that it is possible to easily collect the electroconductive mayenite compound from the sample support 140.

It is clear to a person having ordinary skill in the art that the arrangement of FIG. 3 is one example and the object of processing may be heated using other apparatuses.

[Target for Film Deposition by Vapor Deposition Formed of the Electroconductive Mayenite Compound Having High Electron Density According to an Embodiment of the Present Invention]

In the case of using the above-described production method according to an embodiment of the present invention, it is possible to produce, for example, a target (such as a sputtering target) used in deposition of a film by vapor deposition formed of the electroconductive mayenite compound having high electron density.

As described above, according to the method described in Patent Document 2, at the time of heat treatment, the object of processing is immersed in a liquid of molten aluminum generated by the melting of aluminum particles. Accordingly, there arises a problem in that adhering matter of aluminum firmly adheres to a surface of the object of processing after heat treatment.

Furthermore, such adhering matter is also in adhesion to the container used for heat treatment. Therefore, it is difficult to collect the object of processing without its breakage. In particular, when the object of processing is large in size, it is extremely difficult to collect the object of processing without its breakage.

Because of these problems, it has been difficult to produce a large product formed of the electroconductive mayenite compound having high electron density, for example, a target having a minimum size of 5 mm or more.

According to an embodiment of the present invention, however, it is easy to produce a target for film deposition that includes an electroconductive mayenite compound having an electron density greater than or equal to $5 \times 10^{20}$ cm$^{-3}$ and has a minimum size of 5 mm or more. It is possible to produce a circular planar target that is preferably greater than or equal to 50 mm, more preferably, greater than or equal to 75 mm, still more preferably, greater than or equal to 100 mm, and particularly preferably, greater than or equal to 200 mm in diameter. It is possible to produce a rectangular planar target that is preferably greater than or equal to 50 mm, more preferably, greater than or equal to 75 mm, still more preferably, greater than or equal to 100 mm, and particularly preferably, greater than or equal to 200 mm in length. It is possible to produce a rotatable target that is preferably greater than or equal to 50 mm, more preferably, greater than or equal to 75 mm, still more preferably, greater than or equal to 100 mm, and particularly preferably, greater than or equal to 200 mm in cylinder height.

It is preferable that the target for film deposition by vapor deposition have a greater electron density and relative density. The electron density is preferably greater than or equal to $1.0 \times 10^{21}$ cm$^{-3}$, more preferably, greater than or equal to $1.3 \times 10^{21}$ cm$^{-3}$, and particularly preferably, greater than or equal to $1.5 \times 10^{21}$ cm$^{-3}$. The relative density is preferably greater than or equal to 90%, more preferably, greater than or equal to 93%, and particularly preferably, greater than or equal to 95%.

By depositing a film on a substrate by vapor deposition in an atmosphere where the oxygen partial pressure is less than 0.1 Pa using the target for film deposition of the present invention, it is possible to form an amorphous thin film containing electrons. It is possible to obtain an amorphous thin film containing electrons with an electron density greater than or equal to $2 \times 10^{18}$ cm$^{-3}$ and less than or equal to $2.3 \times 10^{21}$ cm$^{-3}$. The amorphous thin film may be formed of an amorphous solid substance containing calcium, aluminum, and oxygen. That is, by depositing a film on a substrate by vapor deposition in an atmosphere where the oxygen partial pressure is less than 0.1 Pa using the target for film deposition of the present invention, it is possible to form a thin film of an electride of an amorphous oxide containing calcium and aluminum.

The obtained amorphous thin film presents light absorption at a photon energy position of 4.6 eV. The electron density of the obtained amorphous thin film may be greater than or equal to $1 \times 10^{19}$ cm$^{-3}$ and may be greater than or equal to $1 \times 10^{20}$ cm$^{-3}$. The work function of the obtained amorphous thin film may be 2.8 to 3.2 eV. In the obtained amorphous thin film, the ratio of a light absorption coefficient at a position of 3.3 eV to a light absorption coefficient at the photon energy position of 4.6 eV may be less than or equal to 0.35. In the obtained amorphous thin film, the F$^+$ center density may be less than or equal to $5 \times 10^{18}$ cm$^{-3}$.

It is possible to form a thin film of an electron injection layer of an organic EL device using the target for film deposition of the present invention.

EXAMPLES

Next, a description is given of examples of the present invention.

Example 1

An electroconductive mayenite compound having high electron density was produced in the following manner.
[Synthesis of a Mayenite Compound]

First, 313.5 g of calcium carbonate (CaCO$_3$, manufactured by KANTO CHEMICAL CO., INC., special grade) powder and 186.5 g of aluminum oxide (α-Al$_2$O$_3$, manufactured by KANTO CHEMICAL CO., INC., special grade) powder were mixed so as to be 12:7 in mole ratio as converted to calcium oxide (CaO):aluminum oxide (Al$_2$O$_3$). Next, this powder mixture was heated to 1350° C. at a temperature increase rate of 300° C./h and retained at 1350° C. for 6 hours in the atmosphere. Thereafter, this was lowered in temperature at a cooling rate of 300° C./h, so that a white mass body of approximately 362 g was obtained.

Next, after being pulverized to pieces of approximately 5 mm in size by an alumina stamp mill, this white mass body was further pulverized coarsely with an alumina automatic mortar, so that white particles A1 were obtained. The granularity of the obtained white particles A1 was measured by laser diffraction and scattering (SALD-2100, manufactured by Shimadzu Corporation), and the average particle size was 20 μm.

Next, 300 g of the white particles A1, 3 kg of zirconia balls of 5 mm in diameter, and 800 ml of industrial isopropyl alcohol of EL grade as a pulverization solvent were put in a 7-litter zirconia container, and after a zirconia lid was placed on the container, were subjected to ball milling at a rotation speed of 72 rpm for 16 hours.

After the processing, the pulverization solvent was removed by performing suction filtration using the obtained slurry. Furthermore, the residue was put in an oven at 80° C. and dried for 10 hours. As a result, a white powder B1 was obtained. As a result of an X-ray diffraction analysis, the obtained powder B1 was determined to have the C12A7 structure. Furthermore, the obtained powder B1 was determined to be 1.5 μm in average particle size by the above-described laser diffraction and scattering.
[Production of a Forming Body of a Mayenite Compound]

The powder B1 (7 g) obtained in the above-described manner was spread in a mold of 40 mm in length, 20 mm in width, and 30 mm in height. This mold was subjected to uniaxial pressing at a pressing pressure of 10 MPa for 1 minute. Furthermore, cold isostatic pressing was performed at a pressure of 180 MPa, so that a forming body Cl of approximately 38 mm in length, approximately 19 mm in width, and approximately 6 mm in height was obtained.

[Production of an Electroconductive Mayenite Compound]

Next, the electroconductive mayenite compound having high electron density was produced by heating the forming body C1 at high temperatures.

Figure 4:
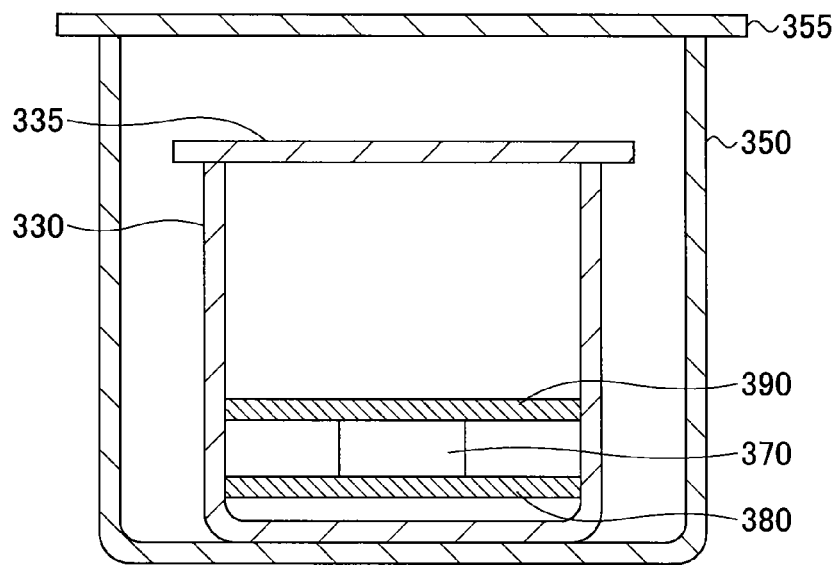
FIG. 4 is a diagram schematically illustrating a configuration of an assembly used in subjecting a forming body according to Example 1 to high temperature treatment.

FIG. 4 illustrates an assembly used in heating the forming body C1. As illustrated in FIG. 4, this assembly 300 includes a first carbon container 330 with a carbon lid 335 and a second carbon container 350 with a carbon lid 355.

The first carbon container 330 has a substantially cylindrical shape of 60 mm in outside diameter, 50 mm in inside diameter, and 60 mm in height. The second carbon container 350 has a substantially cylindrical shape of 80 mm in outside diameter, 70 mm in inside diameter, and 75 mm in height.

This assembly 300 was configured as follows. First, the above-described forming body C1 was cut into a rectangular parallelepiped shape of 8 mm in length, 6 mm in width, and 6 mm in thickness with a commercially available cutter so as to be made an object of processing 370.

Next, this object of processing 370 was covered with commercially available aluminum foil (manufactured by Mitsubishi Aluminum Co., Ltd., 10 µm in thickness). The aluminum foil was doubly provided on each surface of the forming body Cl. Accordingly, the total thickness of the aluminum foil on each surface of the forming body C1 is 20 µm.

Next, a first carbon plate 380 was placed inside the first carbon container 330, and the above-described object of processing 370 was placed on this first carbon plate 380. Furthermore, a second carbon plate 390 was placed on top of the object of processing 370. Each of the first and second carbon plates 380 and 390 has a disk shape of 48 mm in diameter and 5 mm in thickness.

The first carbon plate 380 was provided in order to control the risk of the first carbon container 330 being damaged by the aluminum foil. Furthermore, the second carbon plate 390 was provided in order to control the leakage of aluminum vapor generated from the aluminum foil during heat treatment to the outside of the first carbon container 330.

Next, the carbon lid 335 was placed on top of the first carbon container 330. Furthermore, this first carbon container 330 was placed inside the second carbon container 350. Furthermore, the carbon lid 355 was placed on top of the second carbon container 350.

Here, the second carbon container 350 and the carbon lid 355 were provided in order to prevent aluminum vapor from adhering to a heating element and a heat insulator inside an electric furnace during heat treatment.

Next, the entire assembly 300 thus assembled was placed inside an electric furnace capable of controlling an atmosphere. Furthermore, the electric furnace was evacuated using a rotary pump and a mechanical booster pump. As a result, the pressure inside the electric furnace was reduced to approximately 20 Pa.

Next, heat treatment was performed by heating the assembly 300. The heat treatment was performed by heating the assembly 300 to 1300° C. at a temperature increase rate of 300° C./h, retaining the assembly 300 at this temperature for 6 hours, and thereafter cooling the assembly 300 to room temperature at a temperature decrease rate of 300° C./h.

After this heat treatment, a black substance D1 having a pale white surface was obtained. The aluminum foil did not retain its original features, and it was observed that an aluminum compound remained around the black substance D1. This aluminum compound was adhered to neither the black substance D1, the carbon plate 380, nor the carbon plate 390, so that the black substance D1 was easily collected. The relative density of the black substance D1 was 97.6%.

[Evaluation]

Next, a sample for measuring electron density was collected from the black substance D1. The black substance D1 was coarsely pulverized using an alumina automatic mortar, and the sample was collected from part of the obtained coarse powder that corresponds to the central portion of the black substance D1.

The obtained sample had a dark brown color. As a result of an X-ray diffraction analysis, this sample was found to have only the C12A7 structure. Furthermore, the electron density determined from the peak position of the light diffuse reflection spectrum of the obtained powder was $1.6 \times 10^{21}$ cm$^{-3}$.

From this, the black substance D1 was determined to be a sintered body of an electroconductive mayenite compound having high electron density.

Example 2

An electroconductive mayenite compound having high electron density was produced in the same manner as in Example 1 described above. In this Example 2, however, the heat treatment temperature was 1340° C. in the above-described process of [production of an electroconductive mayenite compound]. The other conditions are the same as in the case of Example 1.

As a result, a black substance having a pale white surface was obtained after the above-described process of [production of an electroconductive mayenite compound].

Example 3

An electroconductive mayenite compound having high electron density was produced in the same manner as in Example 1 described above. In this Example 3, however, the heat treatment temperature was 1360° C. in the above-described process of [production of an electroconductive mayenite compound]. The other conditions are the same as in the case of Example 1.

As a result, a black substance having a pale white surface was obtained after the above-described process of [production of an electroconductive mayenite compound].

Example 4

An electroconductive mayenite compound having high electron density was produced in the same manner as in Example 1 described above. In this Example 4, however, the heat treatment temperature was 1250° C. in the above-described process of [production of an electroconductive mayenite compound]. The other conditions are the same as in the case of Example 1.

As a result, a black substance having a pale white surface was obtained after the above-described process of [production of an electroconductive mayenite compound].

Example 5

An electroconductive mayenite compound having high electron density was produced in the same manner as in Example 1 described above. In this Example 5, however, the heat treatment temperature was 1200° C. in the above-described process of [production of an electroconductive mayenite compound]. The other conditions are the same as in the case of Example 1.

As a result, a black substance having a pale white surface was obtained after the above-described process of [production of an electroconductive mayenite compound].

Example 6

An electroconductive mayenite compound having high electron density was produced in the same manner as in Example 1 described above. In this Example 6, however, the heat treatment temperature was 1150° C. in the above-described process of [production of an electroconductive mayenite compound]. The other conditions are the same as in the case of Example 1.

As a result, a black substance having a pale white surface was obtained after the above-described process of [production of an electroconductive mayenite compound].

Example 7

An electroconductive mayenite compound having high electron density was produced in the same manner as in Example 1 described above. In this Example 7, however, the heat treatment time was 12 hours in the above-described process of [production of an electroconductive mayenite compound]. The other conditions are the same as in the case of Example 1.

As a result, a black substance having a pale white surface was obtained after the above-described process of [production of an electroconductive mayenite compound].

Example 8

An electroconductive mayenite compound having high electron density was produced in the same manner as in Example 1 described above. In this Example 8, however, the heat treatment time was 24 hours in the above-described process of [production of an electroconductive mayenite compound]. The other conditions are the same as in the case of Example 1.

As a result, a black substance having a pale white surface was obtained after the above-described process of [production of an electroconductive mayenite compound].

Example 9

An electroconductive mayenite compound having high electron density was produced in the same manner as in Example 1 described above. In this Example 9, however, the size of the forming body was 55 mm×55 mm×6 mm. Furthermore, in the above-described process of [production of an electroconductive mayenite compound], the aluminum foil was placed on only the top surface and the bottom surface (55 mm×55 mm surfaces) instead of the entire surface of the forming body. The aluminum foil was placed in four layers on each of the top surface and the bottom surface. Accordingly, the total thickness of the aluminum foil is 40 µm each. Furthermore, the heat treatment time was 12 hours. The other conditions are the same as in the case of Example 1.

As a result, a black substance having a pale white surface was obtained after the above-described process of [production of an electroconductive mayenite compound].

Example 10

An electroconductive mayenite compound having high electron density was produced in the same manner as in Example 1 described above. In this Example 10, however, the heat treatment time was 2 hours in the above-described process of [production of an electroconductive mayenite compound]. The other conditions are the same as in the case of Example 1.

As a result, a black substance having a pale white surface was obtained after the above-described process of [production of an electroconductive mayenite compound].

Example 11

An electroconductive mayenite compound having high electron density was produced in the same manner as in Example 1 described above. In this Example 11, however, the size of the forming body was 35 mm×35 mm×22 mm. Furthermore, the heat treatment time was 12 hours and the heat treatment temperature was 1320° C. in the above-described process of [production of an electroconductive mayenite compound]. The other conditions are the same as in the case of Example 1.

As a result, a black substance having a pale white surface was obtained after the above-described process of [production of an electroconductive mayenite compound].

Example 12

An electroconductive mayenite compound having high electron density was produced in the same manner as in Example 1 described above. In this Example 12, however, the pressure was 60 Pa in the above-described process of [production of an electroconductive mayenite compound]. The other conditions are the same as in the case of Example 1.

As a result, a black substance having a pale white surface was obtained after the above-described process of [production of an electroconductive mayenite compound].

Example 13

An electroconductive mayenite compound having high electron density was produced in the same manner as in Example 1 described above. In this Example 13, however, the powder of an electroconductive mayenite compound having an electron density of $5.0 \times 10^{19}$ cm$^{-3}$ was used as the forming body of a mayenite compound.

This electroconductive mayenite compound powder was prepared in the following manner. The forming body C1 in Example 1 was placed in a lidded carbon container. The atmosphere was nitrogen, and it was heated to 1300° C. at a temperature increase rate of 300° C./h and was retained at 1300° C. for 6 hours. Thereafter, this was reduced in temperature at a cooling rate of 300° C./h, so that a black mass body was obtained.

This black mass body was pulverized by the same pulverization method as in [synthesis of a mayenite compound] in Example 1, so that the powder of an electroconductive mayenite compound having an electron density of $5.0 \times 10^{19}$ cm$^{-3}$ was obtained. The obtained powder was determined to have a dark green color and have the C12A7 structure. The average particle size was 1.4 µm. The other conditions are the same as in the case of Example 1.

As a result, a black substance having a pale white surface was obtained after the above-described process of [production of an electroconductive mayenite compound].

Example 14

An electroconductive mayenite compound having high electron density was produced in the same manner as in Example 1 described above. In this Example 14, however, the aluminum foil was placed on only the bottom surface (a surface of 8 mm in length and 6 mm in width) of the object of processing in the above-described process of [production of an electroconductive mayenite compound]. The size of the aluminum foil was 10 mm in length and 8 mm in width, and was so placed as to slightly project from each side of the bottom surface of the object of processing when the aluminum foil came into contact with the bottom surface of the object of processing. Furthermore, the aluminum foil was used by laminating four sheets of the same size. Accordingly, the total thickness of the aluminum foil is 40 μm. The other conditions are the same as in the case of Example 1.

As a result, a black substance having a pale white surface was obtained after the above-described process of [production of an electroconductive mayenite compound].

Example 15

An electroconductive mayenite compound having high electron density was produced in the same manner as in Example 14 described above. In this Example 15, however, the number of sheets of aluminum foil placed on the bottom surface (a surface of 8 mm in length and 6 mm in width) of the object of processing was one. Accordingly, the total thickness of the aluminum foil is 10 μm. The other conditions are the same as in the case of Example 14.

As a result, a black substance having a pale white surface was obtained after the above-described process of [production of an electroconductive mayenite compound].

Example 16

An electroconductive mayenite compound having high electron density was produced in the same manner as in Example 1 described above. In this Example 16, however, a sintered body of a non-electroconductive mayenite compound was used as the object of processing.

The sintered body of a non-electroconductive mayenite compound was produced in the following manner. The forming body C1 obtained by way of the process of [production of a forming body of a mayenite compound] in Example 1 described above was placed on an alumina plate, and was heated to 1100° C. in the atmosphere. The temperature increase rate was 300° C./h. Next, after being retained at 1100° C. for 2 hours, this was cooled to room temperature at a temperature decrease rate of 300° C./h. As a result, a sintered body (hereinafter referred to as "sintered body E16") was obtained. The open porosity of the sintered body E16 was 31%.

The sintered body E16 thus obtained was processed into a rectangular parallelepiped shape of 8 mm in length, 6 mm in width, and 6 mm in thickness, which was used as the object of processing. The other conditions are the same as in the case of Example 1.

As a result, a black substance having a pale white surface was obtained after the above-described process of [production of an electroconductive mayenite compound].

Example 17

An electroconductive mayenite compound having high electron density was produced in the same manner as in Example 16 described above. In this Example 17, however, the sintered body of a non-electroconductive mayenite compound was produced in the following manner.

The forming body C1 obtained by way of the process of [production of a forming body of a mayenite compound] in Example 1 described above was placed on an alumina plate, and was heated to 1300° C. in the atmosphere. The temperature increase rate was 300° C./h. Next, after being retained at 1300° C. for 6 hours, this was cooled to room temperature at a temperature decrease rate of 300° C./h. As a result, a sintered body (hereinafter referred to as "sintered body E17") was obtained. The open porosity of the sintered body E16 was substantially 0%.

The sintered body E17 thus obtained was processed into a rectangular parallelepiped shape of 8 mm in length, 6 mm in width, and 6 mm in thickness, which was used as the object of processing. The other conditions are the same as in the case of Example 16.

As a result, a black substance having a pale white surface was obtained after the above-described process of [production of an electroconductive mayenite compound].

Example 18

An electroconductive mayenite compound having high electron density was produced in the same manner as in Example 1 described above. In this Example 18, however, the above-described process of [production of an electroconductive mayenite compound] was performed in a carbon-free environment. That is, all of the second carbon container 350, the carbon lid 355, the first carbon container 330, the carbon lid 335, the first carbon plate 380, and the second carbon plate 390 were replaced with alumina ones. The other conditions are the same as in the case of Example 1.

As a result, a black substance having a pale white surface was obtained after the above-described process of [production of an electroconductive mayenite compound].

Example 19

An electroconductive mayenite compound having high electron density was produced in the same manner as in Example 1 described above. A forming body of calcined powder, however, was used as the object of processing. The forming body of calcined powder was produced in the following manner.

[Synthesis of Calcined Powder]

First, 313.5 g of calcium carbonate ($CaCO_3$, manufactured by KANTO CHEMICAL CO., INC., special grade) powder and 186.5 g of aluminum oxide ($\alpha$-$Al_2O_3$, manufactured by KANTO CHEMICAL CO., INC., special grade) powder were mixed so as to be 12:7 in mole ratio as converted to calcium oxide (CaO):aluminum oxide ($Al_2O_3$). Next, this powder mixture was heated to 1000° C. at a temperature increase rate of 300° C./h and retained at 1000° C. for 6 hours in the atmosphere. Thereafter, this was lowered in temperature at a cooling rate of 300° C./h, so that approximately 362 g of white powder was obtained. This white powder was easily pulverized with an automatic mortar.

[Production of a Forming Body of Calcined Powder]

Seven grams of the white powder and 0.7 g of industrial isopropyl alcohol (IPA) of EL grade added thereto were mixed with an automatic mortar. Next, this mixture was spread in a mold of 40 mm in length, 20 mm in width, and 30 mm in height. This mold was subjected to uniaxial pressing at a pressing pressure of 10 MPa for 1 minute. Furthermore, cold isostatic pressing was performed at a pressure of 180 MPa.

As a result, a forming body C19 of a size of approximately 38 mm in length, approximately 19 mm in width, and approximately 6 mm in height was obtained. The IPA serves as a binder of the forming body. The forming body C19 was cut into a rectangular parallelepiped shape of 19 mm in length, 8 mm in width, and 6 mm in thickness with a commercially available cutter, and was used as the object of processing. The other conditions are the same as in the case of Example 1.

As a result, a black substance having a pale white surface was obtained after the above-described process of [production of an electroconductive mayenite compound].

In Examples 2 through 19, the aluminum foil did not retain its original features, and it was observed that an aluminum compound remained around the black substances. This aluminum compound was adhered to neither the black substances, the carbon plate 380 (an alumina plate in Example 18), nor the carbon plate 390 (an alumina plate in Example 18), so that the black substances were easily collected.

As a result of the X-ray diffraction of samples collected in the same manner as in Example 1, the black substances obtained in Examples 2 through 19 were found to have only the C12A7 structure. The relative densities and the electron densities of the black substances in Examples 2 through 19 are shown in Table 1.

From the above, the black substances obtained in Examples 2 through 19 were determined to be sintered bodies of a mayenite compound having high electron density.

Comparative Example 1

An attempt was made to produce an electroconductive mayenite compound having high electron density in the same manner as in Example 1 described above. In this Comparative Example 1, however, the heat treatment temperature was 1050° C. in the above-described process of [production of an electroconductive mayenite compound]. The other conditions are the same as in the case of Example 1.

As a result, a black substance D51 having a pale white surface was obtained after the above-described process of [production of an electroconductive mayenite compound]. The relative density of the black substance D51 was 90.9%.

As a result of the X-ray diffraction of a sample collected in the same manner as in Example 1, it was found that the black substance D51 contained many different phases other than the C12A7 structure and that the black substance D51 was not a sintered body of a mayenite compound.

Comparative Example 2

An attempt was made to produce an electroconductive mayenite compound having high electron density in the same manner as in Example 1 described above. In this Comparative Example 2, however, the heat treatment temperature was 1470° C. in the above-described process of [production of an electroconductive mayenite compound]. The other conditions are the same as in the case of Example 1.

As a result, a black substance D52 having a black surface was obtained after the above-described process of [production of an electroconductive mayenite compound]. The black substance D52 was significantly deformed. Furthermore, a large part of the black substance D52 was foamed, so that it was difficult to measure the relative density of the black substance D52.

As a result of the X-ray diffraction of a sample collected in the same manner as in Example 1, it was found that the black substance D52 contained many different phases other than the C12A7 structure and that the black substance D52 was not a sintered body of a mayenite compound.

Comparative Example 3

An attempt was made to produce an electroconductive mayenite compound having high electron density in the same manner as in Example 1 described above. In this Comparative Example 3, however, the forming body C1 was not covered with aluminum foil in the above-described process of [production of an electroconductive mayenite compound]. Instead, aluminum powder was used as an aluminum vapor source.

More specifically, in the above-described assembly 300 illustrated in FIG. 4, an alumina container filled with aluminum powder was placed inside the first carbon container 330. Furthermore, the forming body C1 was placed directly on the aluminum powder. The first carbon plate 380 and the second carbon plate 390 were not used. Furthermore, the heat treatment temperature was 1250° C. The other conditions are the same as in the case of Example 1.

As a result, a black substance D53 was obtained after the above-described process of [production of an electroconductive mayenite compound]. The black substance D53 was half buried in aluminum formed by the melting of the aluminum powder, and was not easily collectable. The alumina container had to be broken to collect the black substance D53. Furthermore, it was difficult to remove molten aluminum. In addition, cracks were observed in the collected black substance D53.

The surface of the black substance D53 was carefully removed using a power saw, a ceramic hand grinder, and sandpaper, and thereafter, the relative density and the electron density of the black substance D53 were checked. The relative density of the black substance D53 was 91.4%.

Furthermore, as a result of the X-ray diffraction of the powder obtained by pulverizing this black substance D53 in the same manner as in Example 1, the black substance D53 was found to have only the C12A7 structure. The electron density of the black substance D53 was $1.4 \times 10^{21}$ cm$^{-3}$, and the electrical conductivity of the black substance D53 was 15 S/cm. From this, the black substance D53 was determined to be the electroconductive mayenite compound having high electron density.

According to Comparative Example 3, however, a lot of effort was required to collect the electroconductive mayenite compound having high electron density. Accordingly, this method is considered as a production method not suitable for industrial production.

In Table 1 below, the type of the object of processing; the heat treatment temperature of the object of processing, the heat treatment time, the surface on which aluminum foil was provided, and the degree of vacuum; and the crystal structure, the relative density and the electron density of the obtained black substance in Examples 1 through 19 and Comparative Examples 1 through 3 are shown together.

TABLE 1

| EXAMPLE | OBJECT OF PROCESSING | HEAT TREATMENT TEMPERATURE OF OBJECT OF PROCESSING (° C.) | HEAT TREATMENT TIME (H) | SURFACE ON WHICH ALUMINUM FOIL WAS PROVIDED |
|---|---|---|---|---|
| EXAMPLE 1 | FORMING BODY | 1300 | 6 | ENTIRE SURFACE |
| EXAMPLE 2 | FORMING BODY | 1340 | 6 | ENTIRE SURFACE |
| EXAMPLE 3 | FORMING BODY | 1360 | 6 | ENTIRE SURFACE |
| EXAMPLE 4 | FORMING BODY | 1250 | 6 | ENTIRE SURFACE |
| EXAMPLE 5 | FORMING BODY | 1200 | 6 | ENTIRE SURFACE |
| EXAMPLE 6 | FORMING BODY | 1150 | 6 | ENTIRE SURFACE |
| EXAMPLE 7 | FORMING BODY | 1300 | 12 | ENTIRE SURFACE |
| EXAMPLE 8 | FORMING BODY | 1300 | 24 | ENTIRE SURFACE |
| EXAMPLE 9 | FORMING BODY SIZE: 55 × 55 × 6 mm | 1300 | 12 | TOP SURFACE AND BOTTOM SURFACE |
| EXAMPLE 10 | FORMING BODY | 1300 | 2 | ENTIRE SURFACE |
| EXAMPLE 11 | FORMING BODY SIZE: 35 × 35 × 22 mm | 1320 | 12 | ENTIRE SURFACE |
| EXAMPLE 12 | FORMING BODY | 1300 | 6 | ENTIRE SURFACE |
| EXAMPLE 13 | FORMING BODY (ELECTROCONDUCTIVE MAYENITE COMPOUND) | 1300 | 6 | ENTIRE SURFACE |
| EXAMPLE 14 | FORMING BODY | 1300 | 6 | BOTTOM SURFACE |
| EXAMPLE 15 | FORMING BODY | 1300 | 6 | BOTTOM SURFACE |
| EXAMPLE 16 | SINTERED BODY | 1300 | 6 | ENTIRE SURFACE |
| EXAMPLE 17 | SINTERED BODY | 1300 | 6 | ENTIRE SURFACE |
| EXAMPLE 18 | FORMING BODY | 1300 (CARBON-FREE) | 6 | ENTIRE SURFACE |
| EXAMPLE 19 | FORMING BODY OF CALCINED POWDER | 1300 | 6 | ENTIRE SURFACE |
| COMPARATIVE EXAMPLE 1 | FORMING BODY | 1050 | 6 | ENTIRE SURFACE |
| COMPARATIVE EXAMPLE 2 | FORMING BODY | 1470 | 6 | ENTIRE SURFACE |
| COMPARATIVE EXAMPLE 3 | FORMING BODY | 1250 | 6 | NONE |

| EXAMPLE | DEGREE OF VACUUM (Pa) | CRYSTAL STRUCTURE | RELATIVE DENSITY (%) | ELECTRON DENSITY ($cm^{-3}$) |
|---|---|---|---|---|
| EXAMPLE 1 | 20 | C12A7 | 97.6 | $1.6 \times 10^{21}$ |
| EXAMPLE 2 | 20 | C12A7 | 97.9 | $1.3 \times 10^{21}$ |
| EXAMPLE 3 | 20 | C12A7 | 98.0 | $7.8 \times 10^{20}$ |
| EXAMPLE 4 | 20 | C12A7 | 97.0 | $1.7 \times 10^{21}$ |
| EXAMPLE 5 | 20 | C12A7 | 94.0 | $1.5 \times 10^{21}$ |
| EXAMPLE 6 | 20 | C12A7 | 90.9 | $1.2 \times 10^{21}$ |
| EXAMPLE 7 | 20 | C12A7 | 97.0 | $1.7 \times 10^{21}$ |
| EXAMPLE 8 | 20 | C12A7 | 97.9 | $1.5 \times 10^{21}$ |
| EXAMPLE 9 | 20 | C12A7 | 97.7 | $1.6 \times 10^{21}$ |
| EXAMPLE 10 | 20 | C12A7 | 97.9 | $1.1 \times 10^{21}$ |
| EXAMPLE 11 | 20 | C12A7 | 97.7 | $9.2 \times 10^{20}$ |
| EXAMPLE 12 | 60 | C12A7 | 97.6 | $1.3 \times 10^{21}$ |
| EXAMPLE 13 | 20 | C12A7 | 97.8 | $1.6 \times 10^{21}$ |
| EXAMPLE 14 | 20 | C12A7 | 97.5 | $1.5 \times 10^{21}$ |
| EXAMPLE 15 | 20 | C12A7 | 97.2 | $1.0 \times 10^{21}$ |
| EXAMPLE 16 | 20 | C12A7 | 97.5 | $1.6 \times 10^{21}$ |
| EXAMPLE 17 | 20 | C12A7 | 96.2 | $1.5 \times 10^{21}$ |
| EXAMPLE 18 | 20 | C12A7 | 96.4 | $1.4 \times 10^{21}$ |
| EXAMPLE 19 | 20 | C12A7 | 90.2 | $9.2 \times 10^{20}$ |
| COMPARATIVE EXAMPLE 1 | 20 | C12A7 + DIFFERENT PHASES | — | — |
| COMPARATIVE EXAMPLE 2 | 20 | C12A7 + DIFFERENT PHASES | — | — |
| COMPARATIVE EXAMPLE 3 | 20 | C12A7 | 91.4 | $1.4 \times 10^{21}$ |

Example 21

An electroconductive mayenite compound having high electron density was produced in the same manner as in Example 1 described above. In the process of [production of a forming body of a mayenite compound] of Example 1, however, a forming body was prepared using a powder mixture including a fluorine component instead of the powder B1, and a fluorine-containing electroconductive mayenite compound was finally produced.

[Preparation Method of a Forming Body]

First, 0.73 g of calcium fluoride ($CaF_2$, manufactured by KANTO CHEMICAL CO., INC., special grade) powder and 0.55 g of aluminum oxide ($\alpha$-$Al_2O_3$, manufactured by KANTO CHEMICAL CO., INC., special grade) powder were added to 38.72 g of the powder B1 obtained in the manner described in the section of [synthesis of a mayenite compound] of Example 1, and these were sufficiently mixed, so that a powder mixture F21 was obtained.

Assuming that the Ca/Al/F composition ratio of this powder mixture F21 is to be maintained in a mayenite compound to be finally produced, the mayenite compound to be produced is expressed by the chemical formula:

$$(12-x)CaO \cdot 7Al_2O_3 \cdot xCaF_2, \qquad (3)$$

where, in particular, x is 0.32.

Next, 7 g of this powder mixture F21 was spread in a mold of 40 mm in length, 20 mm in width, and 30 mm in height. Furthermore, this mold was subjected to uniaxial pressing at a pressing pressure of 10 MPa for 1 minute. Furthermore, cold isostatic pressing was performed at a pressure of 180 MPa. As a result, a forming body C21 having a size of approximately 38 mm in length, approximately 19 mm in width, and approximately 6 mm in height was formed.

Next, the forming body C21 was cut into a rectangular parallelepiped shape of 19 mm in length, 8 mm in width, and 6 mm in thickness with a commercially available cutter, and was used as the object of processing. Furthermore, aluminum foil was placed on the entire surface of the object of processing in the same manner as in Example 1.

As a result, a black substance D21 was obtained. The aluminum foil did not retain its original features, and it was observed that an aluminum compound remained around the black substance D21. This aluminum compound was adhered to neither the black substance D21, the carbon plate 380, nor the carbon plate 390, so that the black substance D21 was easily collected.

The relative density of the black substance D1 was 97.3%.

As a result of the X-ray diffraction of a sample collected in the same manner as in Example 1, the black substance D21 was found to have only the C12A7 structure. Furthermore, the electron density of the black substance D21 was $1.2 \times 10^{21}$ cm$^{-3}$.

As a result of subsequently measuring the lattice constant of the black substance D21, the lattice constant of the black substance D21 was 1.1976 nm. Because the lattice constant of the fluorine-free black substance D1 was 1.1987 nm, the lattice constant of the black substance D21 was found to be smaller than the lattice constant of the black substance D1. From this, the mayenite compound is believed to contain fluorine.

Next, the black substance D21 was fractured, and a composition analysis was performed on a fracture surface by energy-dispersive X-ray spectroscopy (EDX). From the analysis result, the detected fluorine ratio was found to be close to the mixture ratio of the powder mixture F21.

Thus, the black substance D21 was determined to be a sintered body of a fluorine-containing electroconductive mayenite compound having high electron density.

Example 22

An electroconductive mayenite compound having high electron density was produced in the same manner as in Example 21 described above. In the process of [production of an electroconductive mayenite compound], however, the heat treatment temperature of the object of processing was 1340° C. The other conditions are the same as in the case of Example 21.

As a result, a black substance was obtained.

Example 23

An electroconductive mayenite compound having high electron density was produced in the same manner as in Example 22 described above. In the process of [production of an electroconductive mayenite compound], however, the retention time at the time of heat treatment of the object of processing was 2 hours.

As a result, a black substance was obtained.

Example 24

An electroconductive mayenite compound having high electron density was produced in the same manner as in Example 22 described above. In the process of [production of an electroconductive mayenite compound], however, the retention time at the time of heat treatment of the object of processing was 12 hours.

As a result, a black substance was obtained.

Example 25

An electroconductive mayenite compound having high electron density was produced in the same manner as in Example 22 described above. As powder for a forming body, however, the powder of an electroconductive mayenite compound having an electron density of $5.0 \times 10^{19}$ cm$^{-3}$ was used.

This electroconductive mayenite compound powder was prepared in the following manner. The forming body C21 in Example 21 was placed in a lidded carbon container, and heat treatment was performed. The heat treatment atmosphere was nitrogen. Furthermore, the heat treatment was performed by heating the forming body C21 to 1300° C. at a temperature increase rate of 300° C./h and retaining the forming body C21 at 1300° C. for 6 hours. Thereafter, the forming body C21 was reduced in temperature at a cooling rate of 300° C./h, so that a black mass body was obtained.

Next, the obtained black mass body was pulverized, so that powder of 1.4 μm in average particle size was obtained. At this point, the same pulverization method as illustrated in the section of [synthesis of a mayenite compound] in Example 1 (that is, coarse pulverization with an alumina stamp mill and subsequent ball milling using zirconia balls) was performed. As a result of an analysis, the obtained powder had the C12A7 structure, and the electron density was $5.0 \times 10^{19}$ cm$^{-3}$.

An electroconductive mayenite compound having high electron density was produced under the same production conditions as in the case of Example 22 except that the forming body was produced using this electroconductive mayenite compound powder.

As a result, a black substance was obtained.

Example 26

An electroconductive mayenite compound having high electron density was produced in the same manner as in Example 21 described above. In the process of [production of an electroconductive mayenite compound], however, the heat treatment temperature of the object of processing was 1100° C.

As a result, a black substance was obtained.

Example 27

An electroconductive mayenite compound having high electron density was produced in the same manner as in Example 21 described above. In the process of [production of an electroconductive mayenite compound], however, the heat treatment temperature of the object of processing was 1380° C.

As a result, a black substance was obtained.

Example 28

An electroconductive mayenite compound having high electron density was produced in the same manner as in Example 21 described above. In the process of [preparation method of a forming body], however, 1.07 g of calcium fluoride ($CaF_2$, manufactured by KANTO CHEMICAL CO., INC., special grade) powder and 0.82 g of aluminum oxide ($\alpha$-$Al_2O_3$, manufactured by KANTO CHEMICAL CO., INC., special grade) powder were added to 38.11 g of the powder B1, and these were sufficiently mixed, so that a powder mixture F28 was obtained.

Assuming that the Ca/Al/F composition ratio of this powder mixture F28 is to be maintained in a mayenite compound to be finally produced, the mayenite compound to be produced is expressed by the above-described chemical formula (3), and in particular, x is 0.48. The object of processing was obtained in the same manner as in Example 21 except that this powder mixture F28 was used in place of the powder mixture F21 in Example 21, and was used. The heat treatment temperature of this object of processing was 1420° C.

As a result, a black substance was obtained.

Example 29

An electroconductive mayenite compound having high electron density was produced in the same manner as in Example 21 described above. In the process of [preparation method of a forming body], however, 0.12 g of calcium fluoride ($CaF_2$, manufactured by KANTO CHEMICAL CO., INC., special grade) powder and 0.09 g of aluminum oxide ($\alpha$-$Al_2O_3$, manufactured by KANTO CHEMICAL CO., INC., special grade) powder were added to 39.78 g of the powder B1, and these were sufficiently mixed, so that a powder mixture F29 was obtained.

Assuming that the Ca/Al/F composition ratio of this powder mixture F29 is to be maintained in a mayenite compound to be finally produced, the mayenite compound to be produced is expressed by the above-described chemical formula (3), and in particular, x is 0.06. The object of processing was obtained in the same manner as in Example 21 except that this powder mixture F29 was used in place of the powder mixture F21 in Example 21, and was used.

As a result, a black substance D29 was obtained. The relative density of the black substance D29 was 97.8%.

In the case of Example 29 as well, the aluminum foil did not retain its original features, and it was observed that an aluminum compound remained around the black substance D29. This aluminum compound was adhered to neither the black substance D29, the carbon plate 380, nor the carbon plate 390, so that the black substance D29 was easily collected.

As a result of the X-ray diffraction of a sample collected in the same manner as in Example 1, the black substance D29 was found to have only the C12A7 structure. Furthermore, the electron density of the black substance D29 was $1.1 \times 10^{21}$ $cm^{-3}$.

Next, the black substance D29 was fractured, and a composition analysis was performed on a fracture surface. From the analysis result, the detected fluorine ratio was found to be close to the mixture ratio of the powder mixture F29.

Thus, the black substance D29 was determined to be a sintered body of a fluorine-containing electroconductive mayenite compound having high electron density.

Example 30

An electroconductive mayenite compound having high electron density was produced in the same manner as in Example 21 described above. In the process of [preparation method of a forming body], however, 0.28 g of calcium fluoride ($CaF_2$, manufactured by KANTO CHEMICAL CO., INC., special grade) powder and 0.21 g of aluminum oxide ($\alpha$-$Al_2O_3$, manufactured by KANTO CHEMICAL CO., INC., special grade) powder were added to 39.51 g of the powder B1, and these were sufficiently mixed, so that a powder mixture F30 was obtained.

Assuming that the Ca/Al/F composition ratio of this powder mixture F30 is to be maintained in a mayenite compound to be finally produced, the mayenite compound to be produced is expressed by the above-described chemical formula (3), and in particular, x is 0.12. The object of processing was obtained in the same manner as in Example 21 except that this powder mixture F30 was used in place of the powder mixture F21 in Example 21, and was used.

As a result, a black substance D30 was obtained.

Example 31

An electroconductive mayenite compound having high electron density was produced in the same manner as in Example 21 described above. In the process of [preparation method of a forming body], however, 0.47 g of calcium fluoride ($CaF_2$, manufactured by KANTO CHEMICAL CO., INC., special grade) powder and 0.36 g of aluminum oxide ($\alpha$-$Al_2O_3$, manufactured by KANTO CHEMICAL CO., INC., special grade) powder were added to 39.17 g of the powder B1, and these were sufficiently mixed, so that a powder mixture F31 was obtained.

Assuming that the Ca/Al/F composition ratio of this powder mixture F31 is to be maintained in a mayenite compound to be finally produced, the mayenite compound to be produced is expressed by the above-described chemical formula (3), and in particular, x is 0.21. The object of processing was obtained in the same manner as in Example 21 except that this powder mixture F31 was used in place of the powder mixture F21 in Example 21, and was used.

As a result, a black substance D31 was obtained.

Example 32

An electroconductive mayenite compound having high electron density was produced in the same manner as in Example 21 described above. In the process of [preparation method of a forming body], however, 1.07 g of calcium fluoride ($CaF_2$, manufactured by KANTO CHEMICAL CO., INC., special grade) powder and 0.82 g of aluminum oxide ($\alpha$-$Al_2O_3$, manufactured by KANTO CHEMICAL CO., INC., special grade) powder were added to 38.11 g of the powder B1, and these were sufficiently mixed, so that a powder mixture F32 was obtained.

Assuming that the Ca/Al/F composition ratio of this powder mixture F32 is to be maintained in a mayenite compound to be finally produced, the mayenite compound to be produced is expressed by the above-described chemical formula (3), and in particular, x is 0.48. The object of processing was obtained in the same manner as in Example 21 except that this powder mixture F32 was used in place of the powder mixture F21 in Example 21, and was used.

As a result, a black substance D32 was obtained.

In Examples 22 through 32, the aluminum foil did not retain its original features, and it was observed that an aluminum compound remained around the black substances. This aluminum compound was adhered to neither the black substances, the carbon plate 380, nor the carbon plate 390, so that the black substances were easily collected.

As a result of the X-ray diffraction of samples collected in the same manner as in Example 1, the black substances obtained in Examples 22 through 32 were found to have only the C12A7 structure. The relative densities and the electron densities of the black substances are shown in Table 2.

As a result of measuring the lattice constants of the black substances obtained in Examples 22 through 32, the lattice constants of the black substances were smaller than the value of the black substance D1 in Example 1. It is believed that the mayenite compounds contain fluorine. The lattice constant of the black substance D1 of Example 1 was 1.1987 nm, the lattice constant of the black substance D29 of Example 29 was 1.1985 nm, the lattice constant of the black substance D30 of Example 30 was 1.1981 nm, the lattice constant of the black substance D31 of Example 31 was 1.1978 nm, and the lattice constant of the black substance D32 of Example 32 was 1.1969 nm.

The black substances obtained in Examples 22 through 32 were fractured, and a composition analysis was performed on fracture surfaces. From the analysis results, the detected fluorine ratios were found to be close to the mixture ratios of the powder mixtures used as a raw material.

From the above, the black substances obtained in Examples 22 through 32 were determined to be sintered bodies of a fluorine-containing mayenite compound having high electron density.

Figure 5:
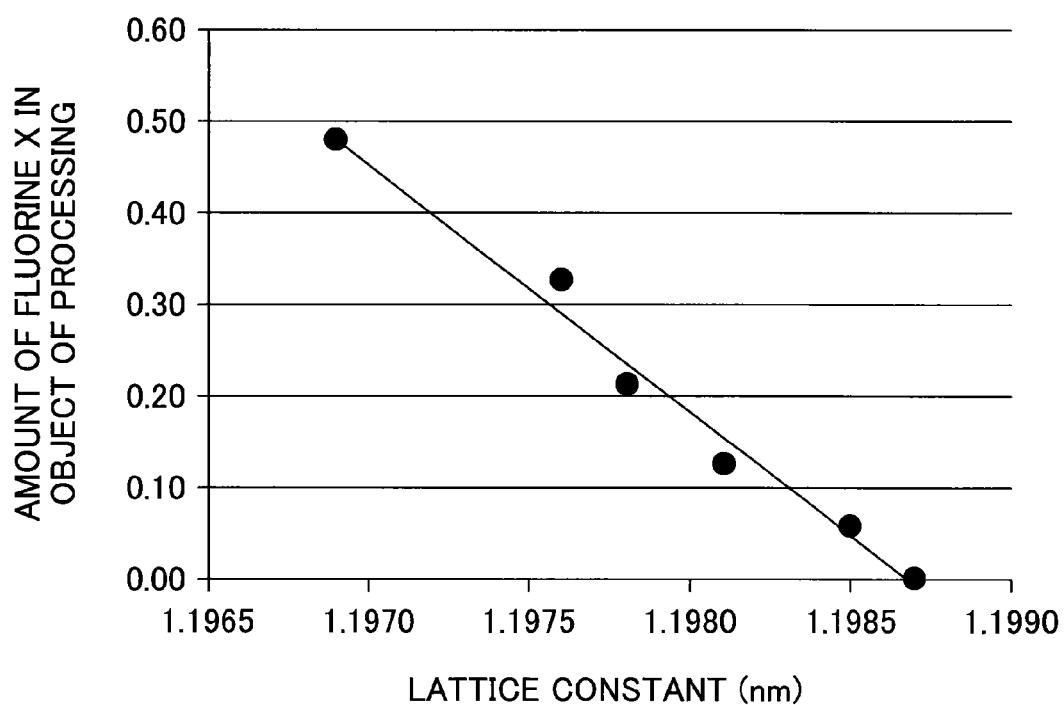
FIG. 5 is a graph illustrating the relationship between the amount of fluorine contained in the object of processing and the lattice constant of the electroconductive mayenite compound having high electron density.

FIG. 5 illustrates the relationship between the measurement results of the lattice constants of the black substances produced in Example 1, Example 21, and Examples 29 through 32 and the amount of fluorine contained in the object of processing (the value of x in Eq. (3)).

FIG. 5 shows that the lattice constant tends to linearly decrease as the amount of fluorine contained in the object of processing increases. It is believed that in Example 21 and Examples 29 through 32, fluorine ions are introduced in the cages of the produced electroconductive mayenite compounds having high electron density. That is, it may be said that as the amount of fluorine contained in the object of processing increases, a larger number of fluorine ions are introduced in the cages of the mayenite compound.

Example 33

An electroconductive mayenite compound having high electron density was produced in the same manner as in Example 22 described above. In the process of [production of an electroconductive mayenite compound], however, a plate-shaped forming body C33 of 113 mm in length, 113 mm in width, and 6 mm in thickness was used as the object of processing. Furthermore, another assembly was used for the heat treatment of the object of processing in place of the assembly 300 illustrated in FIG. 4.

The forming body C33 was produced in the following manner. A granulated powder was prepared in advance by mixing the powder mixture F21 in Example 21 and a vehicle in a weight ratio of 10:1.5 using an automatic mortar. At this point, the vehicle is a liquid in which 10 wt % of polyvinyl butyral (BM-S, manufactured by SEKISUI CHEMICAL CO., LTD.) as a solid content is dissolved in an organic solvent. The organic solvent is a mixture of toluene, isopropyl alcohol, and butanol in a weight ratio of 6:3:1. Polyvinyl butyral serves as a binder to increase the shape retainability of the forming body.

After spreading 125 g of the granulated powder in a mold of 125 mm in length, 125 mm in width, and 50 mm in height, uniaxial pressing was performed at a pressing pressure of 10 MPa for 1 minute. The obtained forming body was dried in an oven at 80° C. for 1 hour in order to volatilize its solvent portion. Furthermore, cold isostatic pressing (CIP) was held at a pressure of 180 MPa for 1 minute, so that the forming body C33 was obtained. This was used as the object of processing.

Figure 6:
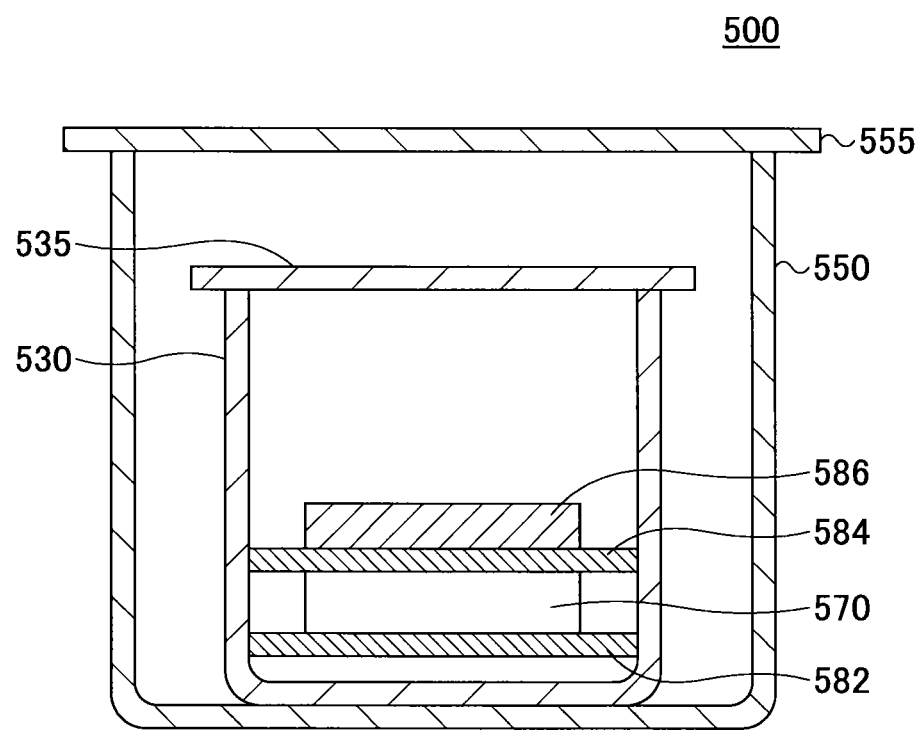
FIG. 6 is a diagram schematically illustrating a configuration of an assembly used in subjecting a forming body according to Example 33 to high temperature treatment.

FIG. 6 schematically illustrates a configuration of an assembly 500 used for the heat treatment of an object of processing 570 (the forming body C33). The assembly 500 includes an alumina container 530 with an alumina lid 535 and a carbon container 550 with a carbon lid 555.

The alumina container 530 has a substantially rectangular parallelepiped shape of 150 mm in length, 150 mm in width, and 50 mm in height. The carbon container 550 has a substantially cylindrical shape of 250 mm in outside diameter, 220 mm in inside diameter, and 140 mm in height.

The assembly 500 was configured as follows. First, multiple sheets of commercially available aluminum foil (manufactured by Mitsubishi Aluminum Co., Ltd.) of 100 mm in length, 100 mm in width, and 10 μm in thickness were prepared. Four sheets of this aluminum foil were laminated on each of two 113 mm long and 113 mm wide surfaces of the object of processing 570 (the forming body C33). The total thickness of the aluminum foil on both surfaces of the object of processing 570 is 40 μm each.

Next, a first alumina plate 582 was placed on a bottom surface of the alumina container 530, and the above-described object of processing 570 was placed on this first alumina plate 582. Next, a second alumina plate 584 was placed on top of the object of processing 570. Each of the first and second alumina plates 582 and 584 has a plate shape of 100 mm in length, 100 mm in width, and 1 mm in thickness.

Furthermore, a carbon plate 586 was placed on the second alumina plate 584. The carbon plate 586 has a plate shape of 100 mm in length, 100 mm in width, and 10 mm in thickness.

The carbon plate 586 was provided in order to control the leakage of aluminum vapor generated from the aluminum foil during heat treatment to the outside of the alumina container 530.

Next, the entire assembly 500 thus assembled was placed inside an electric furnace capable of controlling an atmosphere. Furthermore, the electric furnace was evacuated using a rotary pump and a mechanical booster pump. As a result, the pressure inside the electric furnace was reduced to approximately 20 Pa.

The heat treatment of the object of processing was performed using this assembly 500.

As a result, a black substance D33 was obtained after the above-described process of [production of an electroconductive mayenite compound]. The black substance D33 has a plate shape of 100 mm in length, 100 mm in width, and 5 mm in thickness. The aluminum foil did not retain its original features, and it was observed that an aluminum compound remained around the black substance D33. This aluminum compound was adhered to neither the black substance D33, the first alumina plate 582, nor the second alumina plate 584, so that the black substance D33 was easily collected.

In order to check the homogeneity of the black substance D33, samples were collected from a center portion and an end portion, and were analyzed. The center portion sample was collected from a region around the center of the black substance D33, and the end portion sample was collected from a region within 10 mm from an end of the black substance D33.

The relative density was 97.6% in the center portion sample, and was 97.8% in the end portion sample.

As a result of the X-ray diffraction of both samples, each sample was found to have only the C12A7 structure. Furthermore, the electron density of the center portion sample was $1.1 \times 10^{21}$ cm$^{-3}$, and the electron density of the end portion sample was $1.1 \times 10^{21}$ cm$^{-3}$.

As a result of subsequently measuring the lattice constant of the black substance D33, the lattice constant of the black substance D33 was found to be smaller than the lattice constant of the fluorine-free black substance D1. From this, the mayenite compound is believed to contain fluorine.

This is a result that suggests that the mayenite compound contains fluorine.

Next, the black substance D33 was fractured, and a composition analysis was performed on a fracture surface. From the analysis result, the detected fluorine ratio was found to be close to the mixture ratio of the powder mixture F21.

Thus, the black substance D33 was determined to be a sintered body of a fluorine-containing electroconductive mayenite compound having high electron density.

Example 34

An electroconductive mayenite compound having high electron density was produced in the same manner as in Example 30 described above. As the object of processing, however, a sintered body of a fluorine-containing mayenite compound was used.

The sintered body of a fluorine-containing mayenite compound was produced in the following manner. A forming body C34 was prepared by performing the same operation as in the above-described process illustrated in [preparation process of a forming body] of Example 21 on a powder mixture F30.

Next, the forming body C34 was placed on an alumina plate and was heated to 1380° C. in the atmosphere. The temperature increase rate was 300° C./h. Next, after being retained at 1380° C. for 2 hours, the forming body C34 was cooled to room temperature at a temperature decrease rate of 300° C./h. This was used as the object of processing.

From this, a black substance D34 was obtained. The relative density of the black substance D34 was 95.2%.

In the case of Example 34 as well, the aluminum foil did not retain its original features, and it was observed that an aluminum compound remained around the black substance D34. This aluminum compound was adhered to neither the black substance D34, the carbon plate 380, nor the carbon plate 390, so that the black substance D34 was easily collected.

As a result of the X-ray diffraction of a sample collected in the same manner as in Example 1, the black substance D34 was found to have only the C12A7 structure. Furthermore, the electron density of the black substance D34 was $1.1 \times 10^{21}$ cm$^{-3}$.

As a result of subsequently measuring the lattice constant of the black substance D34, the lattice constant of the black substance D34 was smaller than that of the black substance D1. From this, the mayenite compound is believed to contain fluorine.

Next, the black substance D34 was fractured, and a composition analysis was performed on a fracture surface. From the analysis result, the detected fluorine ratio was found to be close to the mixture ratio of the powder mixture F30.

Thus, the black substance D34 was determined to be a sintered body of a fluorine-containing electroconductive mayenite compound having high electron density.

Example 39

An electroconductive mayenite compound having high electron density was produced in the same manner as in Example 1 described above. In the process of [production of a forming body of a mayenite compound], however, a forming body was prepared using a powder mixture containing a chlorine component in place of the powder B1, and a chlorine-containing electroconductive mayenite compound having high electron density was finally produced.

[Preparation Method of a Foaming Body]

First, 0.39 g of calcium chloride (CaCl$_2$, manufactured by KANTO CHEMICAL CO., INC., special grade) powder and 0.21 g of aluminum oxide ($\alpha$-Al$_2$O$_3$, manufactured by KANTO CHEMICAL CO., INC., special grade) powder were added to 39.39 g of the powder B1 obtained in the manner described in the section of [synthesis of a mayenite compound] of Example 1, and these were sufficiently mixed, so that a powder mixture F39 was obtained.

Assuming that the Ca/Al/Cl composition ratio of this powder mixture F39 is to be maintained in a mayenite compound to be finally produced, the mayenite compound to be produced is expressed by the chemical formula:

$$(12-x)\mathrm{Cao} \cdot 7\mathrm{Al}_2\mathrm{O}_3 \cdot x\mathrm{CaCl}_2, \qquad (4)$$

where, in particular, x is 0.12.

Next, 7 g of this powder mixture F39 was spread in a mold of 40 mm in length, 20 mm in width, and 30 mm in height. Furthermore, this mold was subjected to uniaxial pressing at a pressing pressure of 10 MPa for 1 minute. Furthermore, cold isostatic pressing was performed at a pressure of 180 MPa. As a result, a forming body C39 having a size of approximately 38 mm in length, approximately 19 mm in width, and approximately 6 mm in height was formed.

Next, the forming body C39 was cut into a rectangular parallelepiped shape of 19 mm in length, 8 mm in width, and 6 mm in thickness with a commercially available cutter, and was used as the object of processing. Furthermore, aluminum foil was placed on the entire surface of the object of processing in the same manner as in Example 1. Furthermore, the heat treatment temperature of the object of processing in the process of [production of an electroconductive mayenite compound] was 1340° C.

As a result, a black substance D39 was obtained.

The aluminum foil did not retain its original features, and it was observed that an aluminum compound remained around the black substance D39. This aluminum compound was adhered to neither the black substance D39, the carbon plate 380, nor the carbon plate 390, so that the black substance D39 was easily collected.

The relative density of the black substance D39 was 98.8%.

As a result of the X-ray diffraction of a sample collected in the same manner as in Example 1, the black substance D39 was found to have only the C12A7 structure. Furthermore, the electron density of the black substance D39 was $1.1 \times 10^{21}$ cm$^{-3}$.

As a result of subsequently measuring the lattice constant of the black substance D39, the lattice constant of the black substance D39 was smaller than that of the black substance D1. From this, the mayenite compound is believed to contain chlorine.

Next, the black substance D39 was fractured, and a composition analysis was performed on a fracture surface. From the analysis result, the detected chlorine ratio was found to be close to the mixture ratio of the powder mixture F39.

Thus, the black substance D39 was determined to be a sintered body of a chlorine-containing electroconductive mayenite compound having high electron density.

Example 40

An electroconductive mayenite compound having high electron density was produced in the same manner as in Example 39 described above. In the process of [preparation method of a forming body], however, 1.03 g of calcium chloride (CaCl$_2$, manufactured by KANTO CHEMICAL CO., INC., special grade) powder and 0.55 g of aluminum oxide (α-Al$_2$O$_3$, manufactured by KANTO CHEMICAL CO., INC., special grade) powder were added to 38.43 g of the powder B1, and these were sufficiently mixed, so that a powder mixture F40 was obtained.

Assuming that the Ca/Al/Cl composition ratio of this powder mixture F40 is to be maintained in a mayenite compound to be finally produced, the mayenite compound to be produced is expressed by the above-described chemical formula (4), and in particular, x is 0.32. The object of processing was obtained in the same manner as in Example 39 except that this powder mixture F40 was used in place of the powder mixture F39 in Example 39, and was used.

As a result, a black substance D40 was obtained. The aluminum foil did not retain its original features, and it was observed that an aluminum compound remained around the black substance D40. This aluminum compound was adhered to neither the black substance D40, the carbon plate 380, nor the carbon plate 390, so that the black substance D40 was easily collected.

The relative density of the black substance D40 was 91.2%.

As a result of the X-ray diffraction of a sample collected in the same manner as in Example 1, the black substance D40 was found to have only the C12A7 structure. Furthermore, the electron density of the black substance D40 was $1.1 \times 10^{21}$ cm$^{-3}$.

As a result of subsequently measuring the lattice constant of the black substance D40, the lattice constant of the black substance D40 was smaller than that of the black substance D1. From this, the mayenite compound is believed to contain chlorine.

Next, the black substance D40 was fractured, and a composition analysis was performed on a fracture surface. From the analysis result, the detected chlorine ratio was found to be close to the mixture ratio of the powder mixture F40.

Thus, the black substance D40 was determined to be a sintered body of a chlorine-containing electroconductive mayenite compound having high electron density.

Comparative Example 4

An attempt was made to produce an electroconductive mayenite compound having high electron density in the same manner as in Example 21 described above. The heat treatment temperature, however, was 1050° C. in the above-described process of [production of an electroconductive mayenite compound].

As a result, a black substance D61 having a pale white surface was obtained. The relative density of the black substance D61 was 91.0%.

As a result of the X-ray diffraction of a sample collected in the same manner as in Example 1, the black substance D61 was found to have only the C12A7 structure. The electron density of the black substance D61, however, was $7.2 \times 10^{19}$ cm$^{-3}$, so that it was found that the electron density was not very high.

From the above, it was determined that the black substance D61 was not a sintered body of an electroconductive mayenite compound having high electron density.

Comparative Example 5

An attempt was made to produce an electroconductive mayenite compound having high electron density in the same manner as in Example 21 described above. The heat treatment temperature, however, was 1460° C. in the above-described process of [production of an electroconductive mayenite compound].

As a result, a black substance D62 was obtained. The black substance D62, however, was significantly deformed and was difficult to collect.

In Table 2 below, the type of the object of processing, the amount of added halogen, the heat treatment temperature of the object of processing, the heat treatment time, and the relative density and the electron density of the obtained black substance in Examples 21 through 34, 39 and 40 and Comparative Examples 4 and 5 are shown together.

TABLE 2

| EXAMPLE | OBJECT OF PROCESSING | AMOUNT OF ADDED HALOGEN (xVALUE) | HEAT TREATMENT TEMPERATURE OF OBJECT OF PROCESSING (° C.) |
|---|---|---|---|
| EXAMPLE 21 | FORMING BODY | 0.32 | 1300 |
| EXAMPLE 22 | FORMING BODY | 0.32 | 1340 |
| EXAMPLE 23 | FORMING BODY | 0.32 | 1340 |
| EXAMPLE 24 | FORMING BODY | 0.32 | 1340 |
| EXAMPLE 25 | FORMING BODY | 0.32 | 1340 |
| EXAMPLE 26 | FORMING BODY | 0.32 | 1100 |
| EXAMPLE 27 | FORMING BODY | 0.32 | 1380 |
| EXAMPLE 28 | FORMING BODY | 0.48 | 1420 |
| EXAMPLE 29 | FORMING BODY | 0.06 | 1300 |
| EXAMPLE 30 | FORMING BODY | 0.12 | 1300 |
| EXAMPLE 31 | FORMING BODY | 0.21 | 1300 |
| EXAMPLE 32 | FORMING BODY | 0.48 | 1300 |
| EXAMPLE 33 | FORMING BODY | 0.32 | 1340 |
| EXAMPLE 34 | SINTERED BODY | 0.12 | 1300 |
| EXAMPLE 39 | FORMING BODY (WITH CHLORINE COMPONENT) | 0.12 | 1340 |
| EXAMPLE 40 | FORMING BODY (WITH CHLORINE COMPONENT) | 0.32 | 1340 |
| COMPARATIVE EXAMPLE 4 | FORMING BODY (WITH FLUORINE COMPONENT) | 0.32 | 1050 |

TABLE 2-continued

| EXAMPLE | | | |
|---|---|---|---|
| COMPARATIVE EXAMPLE 5 | FORMING BODY (WITH FLUORINE COMPONENT) | 0.32 | 1460 |

| EXAMPLE | HEAT TREATMENT TIME (h) | RELATIVE DENSITY (%) | ELECTRON DENSITY ($cm^{-3}$) |
|---|---|---|---|
| EXAMPLE 21 | 6 | 97.3 | $1.2 \times 10^{21}$ |
| EXAMPLE 22 | 6 | 98.5 | $1.2 \times 10^{21}$ |
| EXAMPLE 23 | 2 | 97.7 | $1.1 \times 10^{21}$ |
| EXAMPLE 24 | 12 | 98.8 | $1.2 \times 10^{21}$ |
| EXAMPLE 25 | 6 | 98.4 | $1.0 \times 10^{21}$ |
| EXAMPLE 26 | 6 | 92.4 | $1.2 \times 10^{21}$ |
| EXAMPLE 27 | 6 | 98.9 | $1.1 \times 10^{21}$ |
| EXAMPLE 28 | 6 | 95.5 | $9.5 \times 10^{20}$ |
| EXAMPLE 29 | 6 | 97.8 | $1.1 \times 10^{21}$ |
| EXAMPLE 30 | 6 | 97.7 | $1.1 \times 10^{21}$ |
| EXAMPLE 31 | 6 | 97.8 | $1.1 \times 10^{21}$ |
| EXAMPLE 32 | 6 | 96.5 | $1.0 \times 10^{21}$ |
| EXAMPLE 33 | 6 | 97.6 97.8 | $1.1 \times 10^{21}$ |
| EXAMPLE 34 | 6 | 95.2 | $1.1 \times 10^{21}$ |
| EXAMPLE 39 | 6 | 98.8 | $1.1 \times 10^{21}$ |
| EXAMPLE 40 | 6 | 91.2 | $1.1 \times 10^{21}$ |
| COMPARATIVE EXAMPLE 4 | 6 | 91.0 | $7.2 \times 10^{19}$ |
| COMPARATIVE EXAMPLE 5 | 6 | — | — |

The present invention may be applied to, for example, a production method of a target formed of an electroconductive mayenite compound having high electron density.

All examples and conditional language provided herein are intended for pedagogical purposes of aiding the reader in understanding the invention and the concepts contributed by the inventors to further the art, and are not to be construed as limitations to such specifically recited examples and conditions, nor does the organization of such examples in the specification relate to a showing of the superiority or inferiority of the invention. Although one or more embodiments of the present invention have been described in detail, it should be understood that the various changes, substitutions, and alterations could be made hereto without departing from the spirit and scope of the invention.

What is claimed is:

1. A production method of an electroconductive mayenite compound having an electron density greater than or equal to $5 \times 10^{20}$ $cm^{-3}$, comprising:
preparing an object of processing containing a mayenite compound or a precursor of the mayenite compound;
placing aluminum foil on at least a part of a surface of the object of processing; and
retaining the object of processing at a temperature falling within a range of 1080° C. to 1450° C. in a low oxygen partial pressure atmosphere.

2. The production method as claimed in claim 1, wherein a total thickness of the aluminum foil falls within a range of 5 µm to 1000 µm.

3. The production method as claimed in claim 1, wherein the object of processing includes a bottom surface that becomes a lowermost surface in a vertical direction when the object of processing is placed, and
the aluminum foil is placed on the bottom surface of the object of processing in said placing.

4. The production method as claimed in claim 3, wherein the object of processing includes a top surface opposite to the bottom surface, and
the aluminum foil is placed on the top surface of the object of processing in said placing.

5. The production method as claimed in claim 1, wherein the aluminum foil is placed on an entire surface of the object of processing in said placing.

6. The production method as claimed in claim 1, wherein the low oxygen partial pressure atmosphere contains carbon monoxide gas.

7. The production method as claimed in claim 1, wherein said placing and said retaining are performed with the object of processing being placed inside a carbon-containing container.

8. The production method as claimed in claim 1, wherein the object of processing is a forming body including a powder of the mayenite compound, a sintered body including the mayenite compound, or a forming body including a calcined powder.

9. The production method as claimed in claim 1, wherein the object of processing contains a halogen component.

10. The production method as claimed in, claim 1, wherein said placing and said retaining are performed in an environment where a pressure is reduced to less than or equal to 100 Pa or in an atmosphere of an inert gas other than nitrogen.

11. The production method as claimed in claim 1, wherein the electroconductive mayenite compound having a minimum size of 5 mm or more is obtained after said retaining.

12. A method of producing a target for film deposition that includes an electroconductive mayenite compound having an electron density greater than or equal to $0.5 \times 10^{20}$ $cm^{-3}$, the method comprising:
preparing an object of processing containing a mayenite compound or a precursor of the mayenite compound;
placing aluminum foil on at least a part of a surface of the object of processing; and
retaining the object of processing at a temperature of from 1080° C. to 1450° C. in a low oxygen partial pressure atmosphere.

* * * * *